United States Patent
Ryu et al.

(10) Patent No.: US 8,053,346 B2
(45) Date of Patent: Nov. 8, 2011

(54) SEMICONDUCTOR DEVICE AND METHOD OF FORMING GATE AND METAL LINE THEREOF WITH DUMMY PATTERN AND AUXILIARY PATTERN

(75) Inventors: Nam Gyu Ryu, Chungcheongbuk-do (KR); Ho Ryong Kim, Chungcheongbuk-do (KR); Won John Choi, Chungcheongbuk-do (KR); Jae Hwan Kim, Chungcheongbuk-do (KR); Seoung Hyun Kang, Chungcheongbuk-do (KR); Young Hee Yoon, Gyeonggi-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 24 days.

(21) Appl. No.: 12/109,637

(22) Filed: Apr. 25, 2008

(65) Prior Publication Data
US 2008/0265335 A1    Oct. 30, 2008

(30) Foreign Application Priority Data

| | | |
|---|---|---|
| Apr. 30, 2007 | (KR) | 10-2007-0042250 |
| May 11, 2007 | (KR) | 10-2007-0046255 |
| May 15, 2007 | (KR) | 10-2007-0047021 |
| May 18, 2007 | (KR) | 10-2007-0048628 |
| Jun. 29, 2007 | (KR) | 10-2007-0065485 |

(51) Int. Cl.
*H01L 21/28* (2006.01)
*H01L 21/3205* (2006.01)
*H01L 27/088* (2006.01)

(52) U.S. Cl. ....... 438/587; 438/281; 438/283; 438/305; 438/585; 438/926; 430/4; 430/5; 430/6; 430/312; 430/394; 257/202; 257/203; 257/204; 257/205; 257/206; 257/207; 257/208; 257/209; 257/210; 257/211; 257/368; 257/390; 257/499; 257/E29.255; 257/E21.54; 257/E27.06; 257/E21.177

(58) Field of Classification Search .......... 257/390, 257/E27.06, E21.177, 202–211, 368, 499, 257/E29.255, E21.54; 438/587, 585, 281, 438/283, 305, 926; 430/4, 5, 6, 312, 394
See application file for complete search history.

(56) References Cited

U.S. PATENT DOCUMENTS 5,932,900 A * 8/1999 Lin et al. ............... 257/204
(Continued)

FOREIGN PATENT DOCUMENTS

CN    2234328    9/1996
(Continued)

OTHER PUBLICATIONS

KIPO Notice of Patent Grant dated Mar. 26, 2008 for the corresponding application KR 10-2007-0042250.

(Continued)

*Primary Examiner* — N Drew Richards
*Assistant Examiner* — John P Dulka
(74) *Attorney, Agent, or Firm* — Ladas & Parry LLP

(57) ABSTRACT

A gate in a semiconductor device is formed to have a dummy gate pattern that protects a gate. Metal lines are formed to supply power for a semiconductor device and transfer a signal. A semiconductor device includes a quad coupled receiver type input/output buffer. The semiconductor device is formed with a gate line that extends over an active region, and a gate pad located outside of the active region. The gate line and the gate pad are adjoined such that the gate line and a side of the gate pad form a line. Dummy gates may also be applied. The semiconductor device includes a first metal line patterns supplying power to a block having a plurality of cells, a second metal line pattern transferring a signal to the cells, and dummy metal line patterns divided into in a longitudinal direction.

2 Claims, 22 Drawing Sheets

U.S. PATENT DOCUMENTS

| | | | |
|---|---|---|---|
| 6,020,616 A * | 2/2000 | Bothra et al. | 257/381 |
| 6,099,992 A * | 8/2000 | Motoyama et al. | 430/5 |
| 6,635,935 B2 * | 10/2003 | Makino | 257/369 |
| 6,784,051 B2 * | 8/2004 | Lee | 438/244 |
| 6,833,595 B1 * | 12/2004 | Iwasaki | 257/401 |
| 6,903,428 B2 * | 6/2005 | Lee | 257/401 |
| 2004/0213029 A1 * | 10/2004 | Hirata et al. | 365/104 |
| 2005/0274983 A1 * | 12/2005 | Hayashi et al. | 257/206 |
| 2006/0084261 A1 | 4/2006 | Iwaki | |
| 2007/0002617 A1 * | 1/2007 | Houston et al. | 365/185.07 |
| 2007/0013083 A1 | 1/2007 | Kikuchi et al. | |
| 2007/0063223 A1 * | 3/2007 | Choi | 257/202 |

FOREIGN PATENT DOCUMENTS

| | | |
|---|---|---|
| CN | 1401141 A | 3/2003 |
| CN | 1694234 A | 11/2005 |
| JP | 08-160590 A | 6/1996 |
| JP | 2000-174161 A | 6/2000 |
| JP | 2000-223663 | 8/2000 |
| JP | 2005-020008 | 1/2005 |
| KR | 1998-014391 | 5/1998 |
| KR | 1998013909 | 5/1998 |
| KR | 100215832 | 5/1999 |
| KR | 100215832 B1 * | 5/1999 |
| KR | 1999-0084638 | 12/1999 |
| KR | 19990066784 | 11/2000 |
| KR | 1020020039714 A | 5/2002 |
| KR | 1020050068847 | 7/2005 |
| KR | 1020060128352 | 12/2006 |
| KR | 1020070003338 | 1/2007 |
| KR | 1020070036352 | 4/2007 |

OTHER PUBLICATIONS

KIPO Notice of Patent Grant dated Mar. 14, 2008 for the corresponding application KR 10-2007-0048628.

Yasuhiro Takai, et al; "A 250-Mb/s/pin, 1-Gb Double-Data-Rate SDRAM with a Bidirectional Delay and an Interbank Shared Redundancy Scheme", IEEE Journal of Solid-State Circuits, vol. 35, No. 2, Feb. 2000, pp. 149-162.

* cited by examiner

FIG. 7
(PRIOR ART)
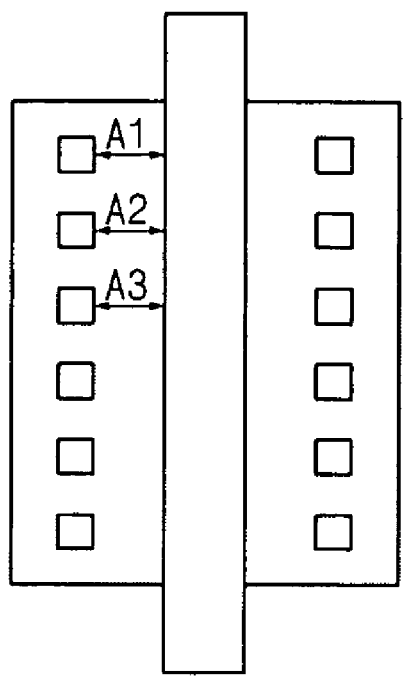
(a)
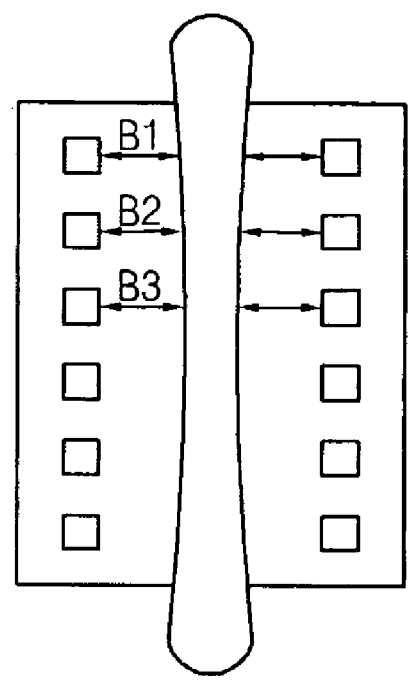
(b)

SEMICONDUCTOR DEVICE AND METHOD OF FORMING GATE AND METAL LINE THEREOF WITH DUMMY PATTERN AND AUXILIARY PATTERN

CROSS-REFERENCE TO RELATED APPLICATIONS

The present application claims priority to Korean patent application numbers 10-2007-0042250, 10-2007-0046255, 10-2007-0047021, 10-2007-0048628, 10-2007-0065485 filed on Apr. 30, 2007, May 11, 2007, May 15, 2007, May 18, 2007, Jun. 29, 2007, respectively, which are incorporated herein by reference in their entirety.

BACKGROUND OF THE INVENTION

The present invention relates generally to a semiconductor device, and more particularly to a method of forming a gate of a semiconductor device, the gate having a dummy gate pattern that protects a gate pattern, a method of forming a metal line that supplies the power for a semiconductor device and transfers a signal, and a semiconductor device including a quad coupled receiver type input/output buffer.

In general, a typical semiconductor device includes devices such as transistors, capacitors, and resistors, and is formed with wirings that electrically connect the devices to one another.

When designing a semiconductor device, the electrical properties, the process influence, and the structural liability of the devices and the wirings should be ensured. More particularly, as a semiconductor device becomes highly integrated, the importance of the pattern and the layout of both the device and the wiring tends to increase.

Further, it is important to consider the gate pattern of MOS transistors when designing the device. The gate of the MOS transistor includes a gate line and a gate pad that are integrally connected to each other. Herein, the gate pad is a portion laid out so that a gate line and a metal layer overlap, and the gate line and the metal layer are electrically connected via a gate contact. Typical the gate pad has a rectangular shape and takes an overlap margin into consideration.

FIG. 1A is an example of a typical gate pad in a MOS transistor of a general semiconductor device. A gate line GL is formed over an active region 10, which constitutes a MOS transistor region, and a gate pad 12 is formed at the end of the gate line GL. Contacts BLC1 that constitute a source and a drain are formed over the active region at both sides of the gate line GL, and contacts BLC2, which are electrically connected to a metal line (not shown) at an upper portion thereof, are formed over the gate pad 12.

Herein, the gate pad 12 is laid out such that a side thereof adjoins an extended end of the gate line GL with a step.

FIGS. 1B and 1C illustrate a MOS transistor formed with at least two gates over the same active region 10. The gate lines GL have different lengths and each gate pad 12 is laid out such that a side thereof adjoins an extended end part of the gate line GL with a step. Also, each gate pad 12 is laid out in the same direction as the gate line GL to which the gate pad 12 adjoins.

The gate pattern in FIGS. 1A through 1C has an advantage in that the layout area is reduced as wiring connections between MOS transistors are minimized in a layout structure as shown in FIG. 2.

FIG. 2 illustrates a case where MOS transistors are used to construct a single circuit. Herein, a semiconductor device may have a structure that utilizes the same type of MOS transistor and arranges the MOS transistor in a line in one well region 22 defined by an active guard 20.

Each gate pad 12 is connected to the corresponding gate line GL by adjoining the gate pad 12 to the corresponding gate line GL (as in MOS transistor TR1) or by disposing the gate pad 12 at an area outside of an adjacent transistor's active region 10 and extending a portion of the side thereof (as in transistor TR2). Also, each active region 10 is irregularly disposed in the well region 22 according to the connection relationship between the MOS transistors (such as the transistors TR1 and TR2).

When the transistors TR1 and TR2 are disposed as in FIG. 2, the length of connection wiring can be minimized when connected to a drain (or a source) region of the transistor TR1 and a gate of the transistor TR2.

However, in the case of FIGS. 1A through 1C and 2, the gate of each transistor has many critical points, i.e. right-angled corners at portions where the gate line and the gate pad are connected. The critical points can cause a reduction in the process margin and an increase in the resistance due to the layout. Thus, the circuit properties of the transistor are lowered.

Additionally, if the active regions 10 are disposed irregularly (as shown in FIG. 2) in order to minimize the wiring connection between the transistors, the distances 'GT1'-'GT4' between the gate pad region 12 of each transistor and the active guard 20 are different, and the distances 'AT1'-'AT2' between the active region 10 of each transistor and the active guard 20 are different.

Additionally, spaces 'a', 'b', and 'c' between the gates of the adjacent transistors are different. Therefore, the line width of the gate of the transistor may vary as a difference of mass of the gate. Such a variation in the line width of the gate may cause changes in the electrical characteristics of the transistor, and a problem is caused in that it is difficult to operate an optical proximity correction for ensuring a uniform variation in the line width.

Meanwhile, when designing the wiring that includes the gate, it is important to ensure physical and electrical stabilities.

Referring to FIG. 3, in a general semiconductor device, a plurality of block cells BC1 through BC4, which are formed by a gathering of unit cells UC in a peripheral region, is disposed. Power metal line patterns 1 for supplying a power voltage VDD and a ground voltage VSS to each block cell BC1 through BC4 are disposed in parallel to each other, and signal metal line patterns 2 for transferring a routing signal between the block cells are irregularly disposed.

In a process of forming the aforementioned power metal line patterns 1 or signal metal line patterns 2, a chemical mechanical polishing process for formation of an oxide layer and planarization is performed after the formation of the metal line patterns 1 and 2.

However, as shown in FIG. 3, when the spaces between the metal line patterns 1 or 2 are different from one another, a dishing phenomenon can occur in a region having a low pattern density due to a planarization process used to etch metal. Therefore, a problem exists, in that it is difficult to ensure the stability of the metal line pattern when the metal line patterns are laid out as shown FIG. 3.

In order to ensure the stability of the metal line pattern, dummy metal line patterns 3 may be disposed between the metal line patterns 1 and 2 as shown in FIG. 4, which corresponds to FIG. 3.

In the case of FIG. 4, the dummy metal line patterns 3 disposed between the metal line patterns 1 and 2 are formed in a bar type parallel to the longitudinal direction of the metal line patterns 1 and 2. Also, dummy metal line patterns 3 have a predetermined width W defined as a design rule and a length L corresponding to a length of adjacent metal line pattern 1 or 2.

However, in the case of FIG. 4, a defect can occur when a particle P forms a bridge between the metal line pattern 1 or 2 and the dummy metal line pattern 3.

Meanwhile, when designing the wiring, it is also important to consider the electrical characteristics of the MOS transistor.

An input/output buffer of a semiconductor device having the MOS transistor should be designed so as to have a strengthened noise characteristic for a fast response characteristic. Also, the power line used in the input/output buffer should be designed so that the power line is not influenced by noise.

In a semiconductor device operating at a high speed, a quad coupled receiver type input/output buffer having a differential amplification structure that compares and amplifies a reference voltage VREF and an input signal IN as shown in FIG. 5 is mainly used.

In the quad coupled receiver type input/output buffer having the differential amplification structure, the electrical characteristics of the two MOS transistors <M11, M21>, <M12, M22>, <M31, M41> and <M32, M42> that form a differential pair or a current mirror should be the same for normal differential amplification.

However, the circuit construction causes the channel lengths of the MOS transistors to be different from one another, and as such the electrical characteristics of each MOS transistor may be different from the expected characteristics when the MOS transistors having different channel lengths are disposed adjacently as shown in FIG. 6.

Specifically, the MOS transistor pair M12 and M22 and the MOS transistor pair M32 and M42 are aligned in a sequence of 'M12, M32, M22, M42' as shown in FIG. 6. MOS transistors TR1 and TR2 are disposed at a side of the MOS transistor M12 and at a side of the MOS transistor M42 respectively.

The patterns between the active regions of the MOS transistors are gate dummies GD. The MOS transistors TR1 and TR2 of FIG. 6 correspond to the MOS transistors M5, INV1, and INV2, which do not require the same electrical characteristics, in the input/output buffer of FIG. 5.

As shown in FIG. 6, the MOS transistor pair M12 and M22 and the MOS transistor pair M32 and M42 having different channel lengths are alternately disposed. The gate dummy GD is disposed between the MOS transistors in order to minimize a variation in the gate critical dimension of the gate G.

However, since MOS transistors TR1 and M32 having different channel widths are disposed on both sides of a MOS transistor (for example, M12), the gate critical dimension of the gate of the MOS transistor M12 varies even though the gate dummy GD is disposed between the active regions.

In other words, when the channel widths of the adjacent MOS transistors are the same, the MOS transistors can have the electrical characteristics intended by the designer, since the pattern of the gate G of the MOS transistor is not changed as shown in FIG. 7A (distances A1 through A3 between a side surface of the gate and a contact are all the same).

However, when the channel widths of the adjacent MOS transistors are different, the MOS transistors may have electrical characteristics different from those intended by the designer, since the pattern of the gate G of the MOS transistor is changed as shown in FIG. 7B (distances B1 through B3 between a side surface of the gate and a contact are different).

SUMMARY OF THE INVENTION

It is an objective of the present invention to provide a pattern that is capable of ensuring electrical characteristics, a process influence, and a structural stability in a semiconductor device.

Another object of the present invention is to reduce formation of a critical point in the gate of a transistor included in a semiconductor device and enhance a uniformity of a critical dimension of the gate.

A further object of the present invention is to structurally stabilize a dummy gate pattern that is formed to realize a semiconductor device.

A further object of the present invention is to provide a layout method of a semiconductor device that is capable of minimizing deviations generated during manufacturing processes.

Another object of the present invention is to provide a semiconductor device in which the dummy gates are disposed in consideration of a spaced distance between the transistors and a length of the peripheral gate, and thus variation in a line width of a gate channel according to the process deviation can be reduced.

Another object of the present invention is to provide a semiconductor device having a pattern capable of supporting the dummy gate thus preventing a defect in the dummy gate caused by variation in a process procedure.

Another object of the present invention is to provide a semiconductor device in which the uniformity of a critical region of the gate is enhanced by the dummy gate, thus improving the operation accuracy of the transistor.

Another objective of the present invention is to provide a metal line pattern forming method that reduces a density difference of the metal line pattern and a dishing due to a chemical mechanical polishing process, thus enhancing the uniformity of the metal line pattern.

Another object of the present invention is to provide a metal line pattern forming method in which a power metal line pattern, which is reduced with a high integration, is complemented, thus leading to the stable supply of power to a semiconductor memory.

Another object of the present invention is to provide a metal line pattern forming method that leads to a reduction in a short defect including a dummy metal line pattern disposed between metal line patterns.

Another object of the present invention is to provide a metal line pattern forming method in which the dummy metal line pattern can be stably formed.

Another object of the present invention is to form a pattern of MOS transistors so that the MOS transistors, which require the same electric characteristics, are subjected to the same influences during the manufacturing process.

Another object of the present invention is to form a pattern of MOS transistors so that MOS transistors having a differential relationship or a current mirror relationship have the same gate channel on an actual pattern.

Another object of the present invention is to provide a quad receiver type input/output buffer in which the electric characteristics of the MOS transistors of the quad receiver type input/output buffer that have a differential relationship or a current mirror relationship are the same on an actual pattern.

To achieve these objects of the present invention, according to a first aspect of the present invention, there is provided a method of forming a gate in a semiconductor device, including forming a gate line that extends in a longitudinal direction over an active region; and forming a gate pad that is located outside of the active region and that is adjoined to the gate line such that a side of the gate pad and the gate line form a line.

A plurality of the gates (including the gate line and the gate pad) may be formed over the same active region, and the gate pads of the adjacent gates may be formed such that they protrude in opposite directions or may be formed on opposite edges of the gates while protruding in opposite directions.

According to a second aspect of the present invention, there is provided a method of forming a plurality of gates in a semiconductor device, including forming at least one gate line which extends in a longitudinal direction over each of a plurality of active regions in a well region; and forming a gate pad corresponding to each gate line and adjoining the gate line and gate pad in the same manner described above. A side of each of the gate pads is aligned such that there is a predetermined spacing between each of the gate pads and a predetermined boundary location.

A plurality of the gates (including the gate line and the gate pad) may be formed over the same active region, and the gate pads of the adjacent gates may be formed such that they protrude in opposite directions or may be formed such that the gate pads are on opposite sides of the active region and protrude in opposite directions.

Preferably, the well region in which the active regions are formed is defined by the active regions and an active guard surrounding the well region.

Preferably, a side of each active region is arranged such that a side of each active region is aligned.

Preferably, when at least two gate lines having different lengths are formed, a gate dummy pattern is formed over an unoccupied area of the relatively short gate line.

According to a third aspect of the present invention, there is provided a method of forming a dummy gate pattern of a semiconductor device including: forming a gate over an active region to form a transistor; forming a dummy gate pattern adjacent to at least one side surface of the transistor; and forming an auxiliary pattern that connects to the dummy gate pattern and structurally supports the dummy gate pattern.

The dummy gate pattern may be formed between adjacent transistors having different gate lengths, and the auxiliary pattern may be formed so as to extend to a vacant space formed by a difference in the gate lengths.

Additionally, two or more dummy gates may be formed between adjacent transistors, and part of the opposing sides of the dummy gates may be connected by an auxiliary pattern.

Preferably, the dummy gate has the same length as the gate, which includes the gate line and the gate pad.

The auxiliary pattern may be formed at an end of the dummy gate pattern and is formed in a rectangle having a larger width than the dummy gate pattern.

The auxiliary pattern may also be formed in a rectangular ring shape that is partially coupled to the dummy gate pattern.

According to a fourth aspect of the present invention, there is provided a method of forming metal lines of a semiconductor device including: forming first metal line patterns that supply power to a block having a plurality of cells; forming a second metal line pattern that transfers a signals to the cells between the first metal line patterns; forming dummy metal line patterns that are divided in a longitudinal direction between the second metal line patterns.

The first metal line pattern may be incorporated with another first metal line pattern that is formed in another block and that supplies the same power.

The dummy metal line pattern is formed in a bar shape and an auxiliary dummy metal line pattern connects adjacent dummy metal line patterns.

According to a fifth aspect of the present invention, there is provided a semiconductor device, including a first MOS transistor pair formed adjacently and symmetrically with respect to a predetermined reference line of a substrate; and at least one second MOS transistor pair formed symmetrically with respect to the reference line and on outsides of the first metal line pair, wherein the first and second MOS transistor pairs each include MOS transistors that require the same electric characteristics.

Preferably, the first and second MOS transistor pairs include a differential pair which is controlled by a differential signal and operates to differential amplify, and a current mirror structure which is controlled by a common signal and generates the same current, respectively.

Preferably, gates of the first and second MOS transistor pairs are formed symmetrically with respect to the reference line, such that they are both equal distances from the reference line.

Preferably, the first MOS transistor pair includes first MOS transistors having the same channel length as each other and the second MOS transistor pair includes second MOS transistors having the same channel length as each other.

Preferably, a gate dummy pattern is further formed at both sides of each MOS transistor.

Preferably, a length of the gates of the second transistor pair is larger than a length of the gates of the first transistor pair, and the gate dummy pattern formed between the first MOS transistor pair and the second MOS transistor pair has a length that is the same as the length of the gate of the second MOS transistor pair.

Preferably, the gate dummy patterns between the first and second transistor pair includes a bar shaped main gate dummy and an auxiliary gate dummy connected to a portion of the bar shaped main gate dummy and protruding into a space left unoccupied by the difference in lengths of the gates of the first and second transistor pair. Preferably, a gate dummy pattern having a length corresponding to the length of the gates of the second MOS transistor is formed at an outside of the second MOS transistor pair.

Preferably, the gate dummy pattern at the outsides of the second MOS transistor pair has a structure in that two bar shaped gate dummy having a length corresponding to the length of the gate of the second MOS transistor are integrated through a coupling part.

BRIEF DESCRIPTION OF THE DRAWINGS

FIG. 7 is a view illustrating a gate deflection phenomenon of a MOS transistor.

DESCRIPTION OF SPECIFIC EMBODIMENTS

Hereinafter, preferred embodiments of the present invention will be described in detail with reference to the accompanying drawings.

A semiconductor device of the present invention includes a plurality of MOS transistors aligned in a line formation within a predetermined well region. A gate of the MOS transistor includes an integrated gate line and a gate pad, and the gate pad is disposed on the same surface as the gate line with respect to an extended line of an edge of the gate line and aligned so that a side thereof adjoins the extended line.

More specifically, the semiconductor device of the present invention includes a predetermined MOS transistor, and the gate of the MOS transistor has a structure wherein a gate line, which is formed over an active region of the MOS transistor, and a gate pad, which is electrically connected to a metal line of an upper layer of the MOS transistor, are integrated. Herein, the gate may have shapes as shown in FIGS. 8A through 8E.

Figure 8A:
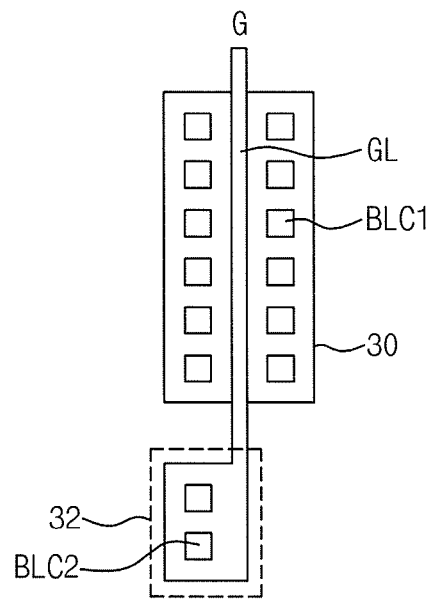
FIG. 8A is a layout diagram illustrating a method of forming a gate of a semiconductor device according to the present invention.

First, referring to FIG. 8A, a gate G is formed over an active region 30, and a channel region is formed in the active region that overlaps with the gate G. A drain region and a source region are formed in the active region 30 on both sides of the channel region.

Additionally, a gate pad 32 is located at one of the two longitudinal ends of the gate that extends away from the active region 30. At this time, the gate pad 32 is disposed in the same surface as the gate line GL on the basis of an extended line of an edge of the gate line GL, and the gate pad 32 and the gate line GL are aligned so that a side of the gate pad 32 adjoins to the extended gate line GL. Preferably, the gate pad 32 has a rectangular shape including an adjoining part that connects to the gate line GL.

Further, contacts BLC1, which are electrically connected to a metal line of the upper layer, are formed over the drain and source regions of the active region, and contacts BLC2, which are electrically connected to a metal line of the upper layer, are formed over the gate pad 32.

FIGS. 8B through 8E show a structure of each gate G when at least two gates G are formed over the same active region 30.

Figure 8B:
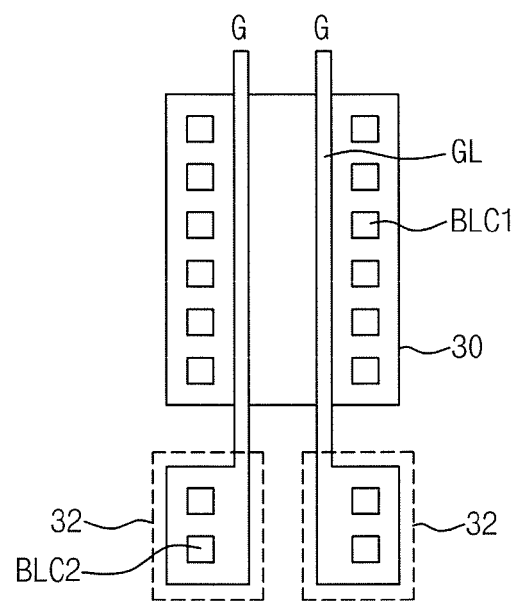
FIGS. 8B and 8C are layout diagrams illustrating a method of forming a gate of a semiconductor device having two gates.
Figure 8C:
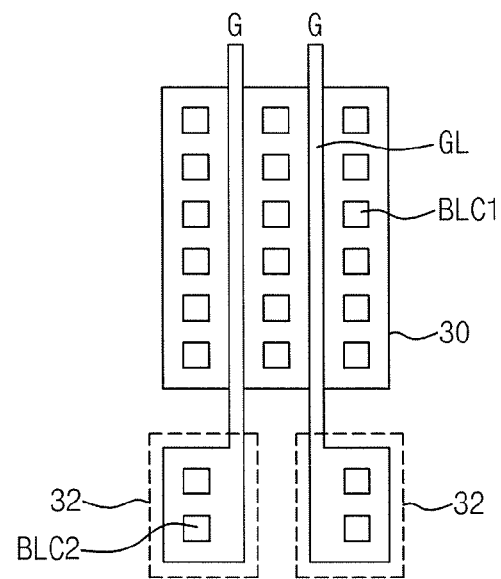

As can be appreciated from FIGS. 8B and 8C, when two gate lines GL are formed over the same active region 30, the gate pads 32 are formed at the same end of the gate line GL, and the gate pads 32, each corresponding to different gate line GL, may be formed symmetrically.

Figure 8D:
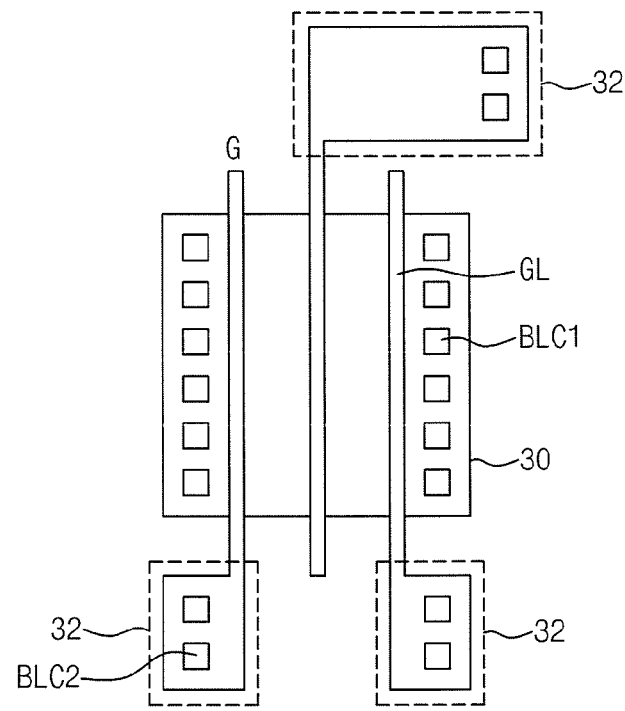
FIGS. 8D and 8E are layout diagrams illustrating a method of forming a gate of a semiconductor device having three gates.
Figure 8E:
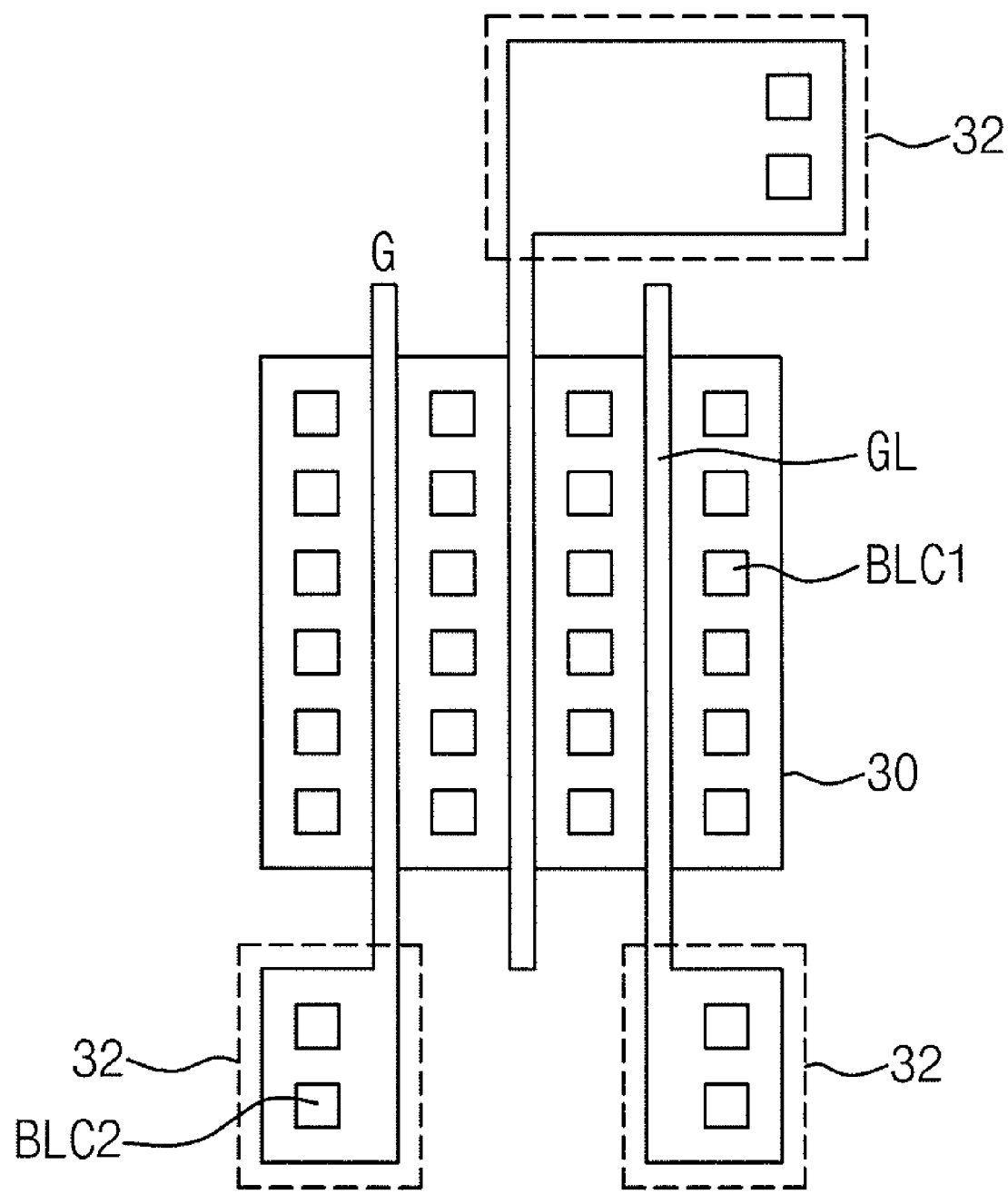

Additionally, as can be appreciated from FIGS. 8D and 8E, when three gate lines GL are formed over the same active region 30, the gate pads 32 corresponding to adjacent gate lines GL are formed at longitudinally opposite ends of the gate line GL, and the gate pads 32 formed on the same side (i.e. the gate lines that are not adjacent) may be formed symmetrically.

As such, the MOS transistor provided for a semiconductor device of the present invention is provided with a gate in which the gate line GL and the gate pad are integrated, and the MOS transistor has a structure wherein the gate pad 32 is disposed in the same surface as the gate line on the basis of an extended line of an edge of the gate line GL and aligned such that a side of the gate pad 32 adjoins the extended line.

As such, an edge, i.e. the critical point at a portion where the gate and the gate pad are connected, is reduced. Therefore, a process margin is increased and a resistance due to the layout is decreased, thus the diminishment of the circuit properties of the transistor can be prevented.

Figure 9:
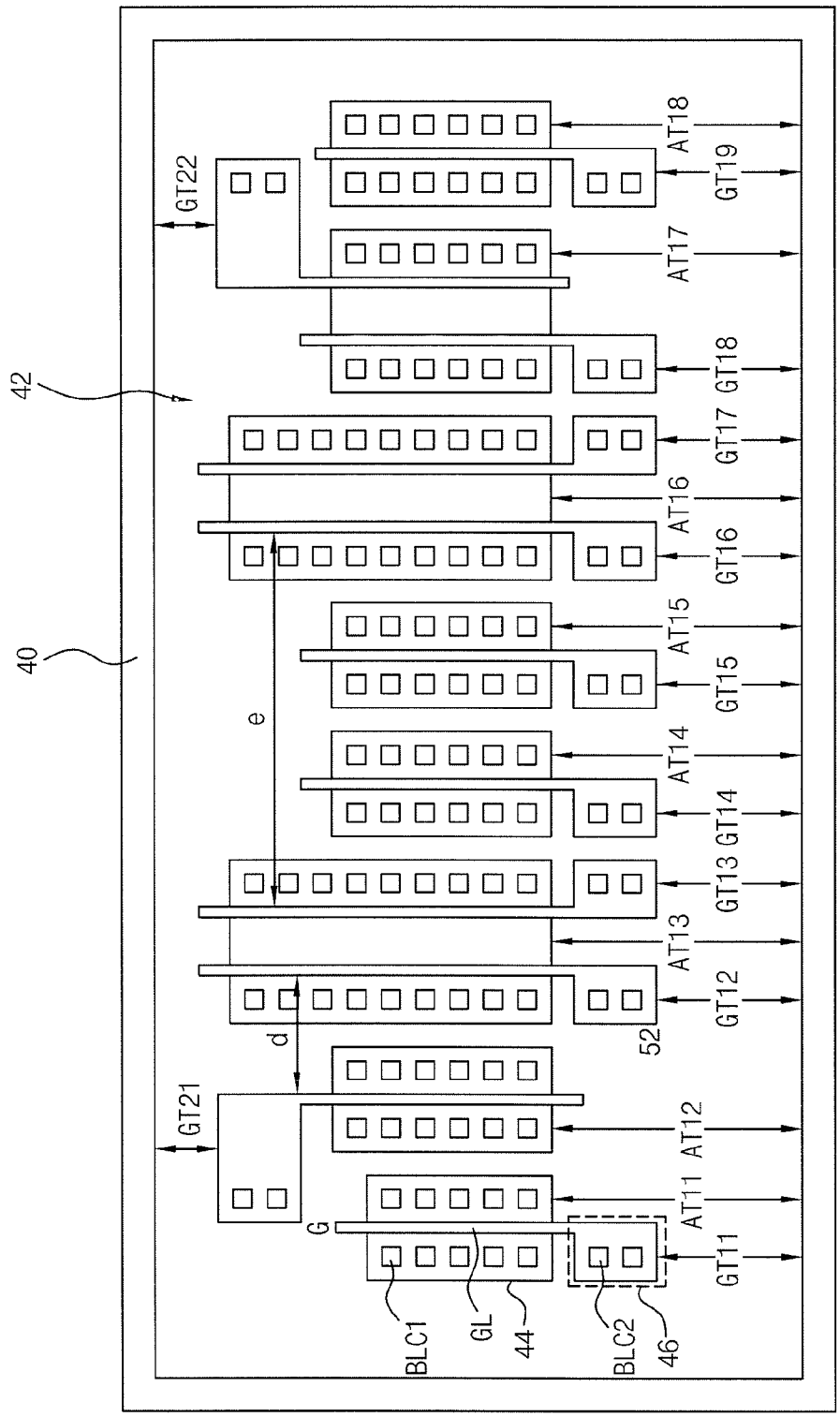
FIG. 9 is a layout diagram illustrating a semiconductor device including a MOS transistor according to the present invention.

The transistors having the aforementioned layout may be disposed in a well region as shown in FIG. 9.

Referring to FIG. 9, a well region 42 is defined by a predetermined active guard 40 and a plurality of active regions 44 that are formed within the well region 42 in a line with predetermined spacing. Preferably, the active regions 44 are arranged such that the longitudinal ends of each of the active regions 44 are aligned with one another.

Additionally, at least one gate G is formed over the respective active regions 44, and a gate pad 46 is located at one of the two ends of each gate G.

Herein, the gate pads 46 are formed to have the same length and are preferably standardized in a rectangular shape having a part adjoining the gate pad 46 to the gate line GL.

Additionally, in a case where the gate is electrically connected with another adjacent drain (or source) region, the gate pad 46 has a rectangular shape, including the part adjoining the gate line GL, which projects towards the adjacent drain (or source) region. Thus, the gate pad 46 may be disposed such that the contacts BLC2 are located on an extended line of the contacts BLC1 of the adjacent drain (or source) region or the active region.

As such, when the sides of the active regions 44 are aligned, distances 'AT11' through 'AT18' between the aligned sides of the active regions 44 and the active guard 40 are the same.

Also, when the gate pads 46 are standardized and aligned with respect to the active guard 40, the distances between the sides of the gate pad 46 and the active guard 40 are the same, i.e. the spacings indicated by 'GT11' through 'GT19' are the same and spacings indicated by 'GT21' through 'GT22' are the same.

Figure 10:
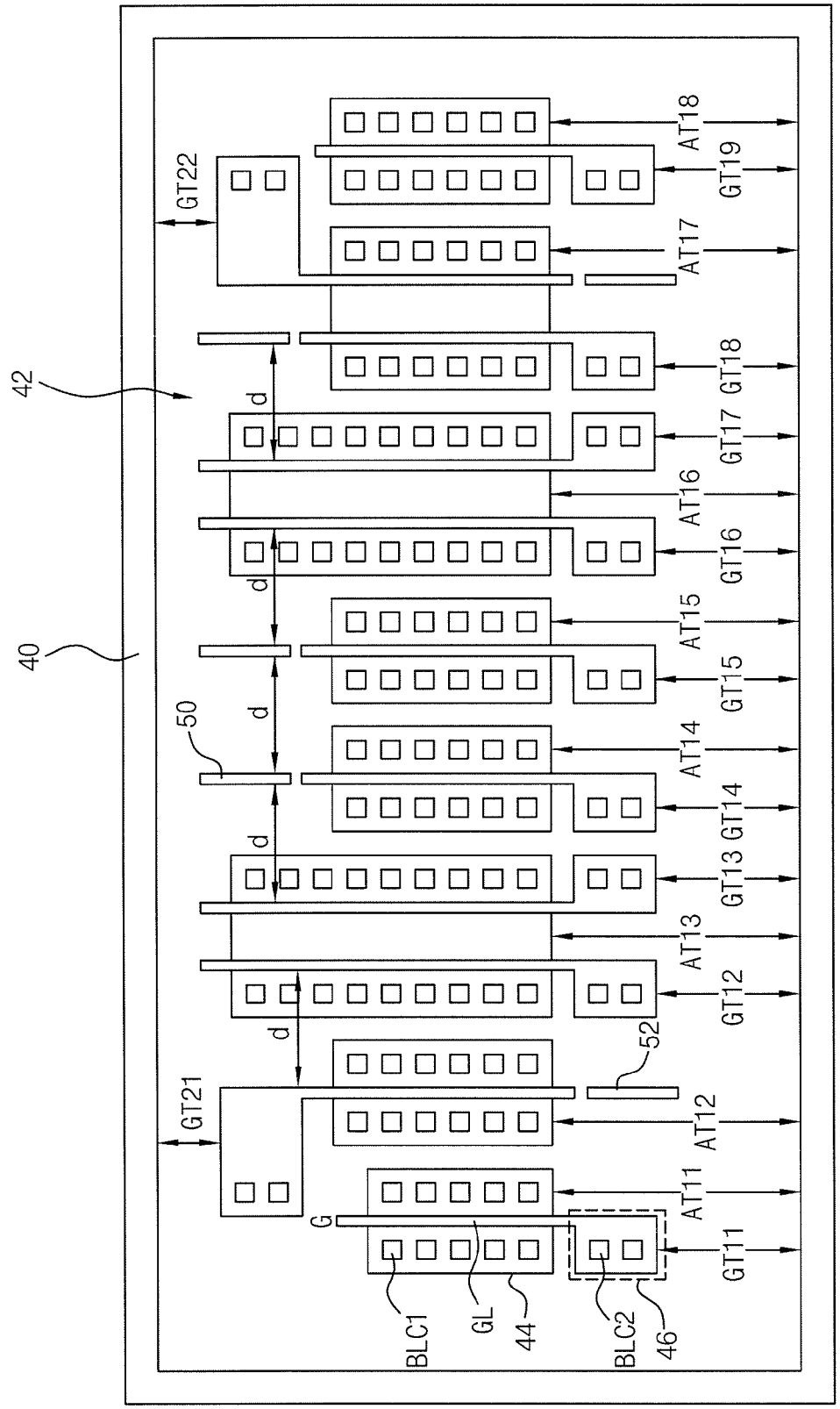
FIG. 10 is a layout diagram in which a gate dummy pattern is formed in the layout of FIG. 9.

In order to make the spacings between two adjacent gates G constant, in the layout of FIG. 9, where there are different distances "d" and "e" between the gates, a gate dummy pattern 50 may be formed on an extended line of the gate. As shown in FIG. 10, the gate dummy pattern 50 has a relatively short length in a case where the lengths of two adjacent gates G are different.

Additionally, if the spacing between two adjacent gate pads 46 is large, a gate dummy pattern 52 may be disposed between the two gate pads 46. At this time, it is preferable that the gate dummy pattern 52 is disposed on an extended line of the gate disposed between the two gate pads 46.

Therefore, the space between two adjacent gates G becomes a constant 'd' as indicated in FIG. 10, and as such the uniformity of the gate critical dimension is enhanced.

Further, the uniformity of the gate critical dimension of the transistor prevents the lowering of circuit properties in a transistor, and an optical proximity correction operation, which ensures the critical dimension of the gate G, can be facilitated.

Meanwhile, the present invention may have a structure in which an auxiliary pattern, which supports a side surface of the dummy gate pattern, is formed in the dummy gate pattern to ensure structural stability.

Figure 11:
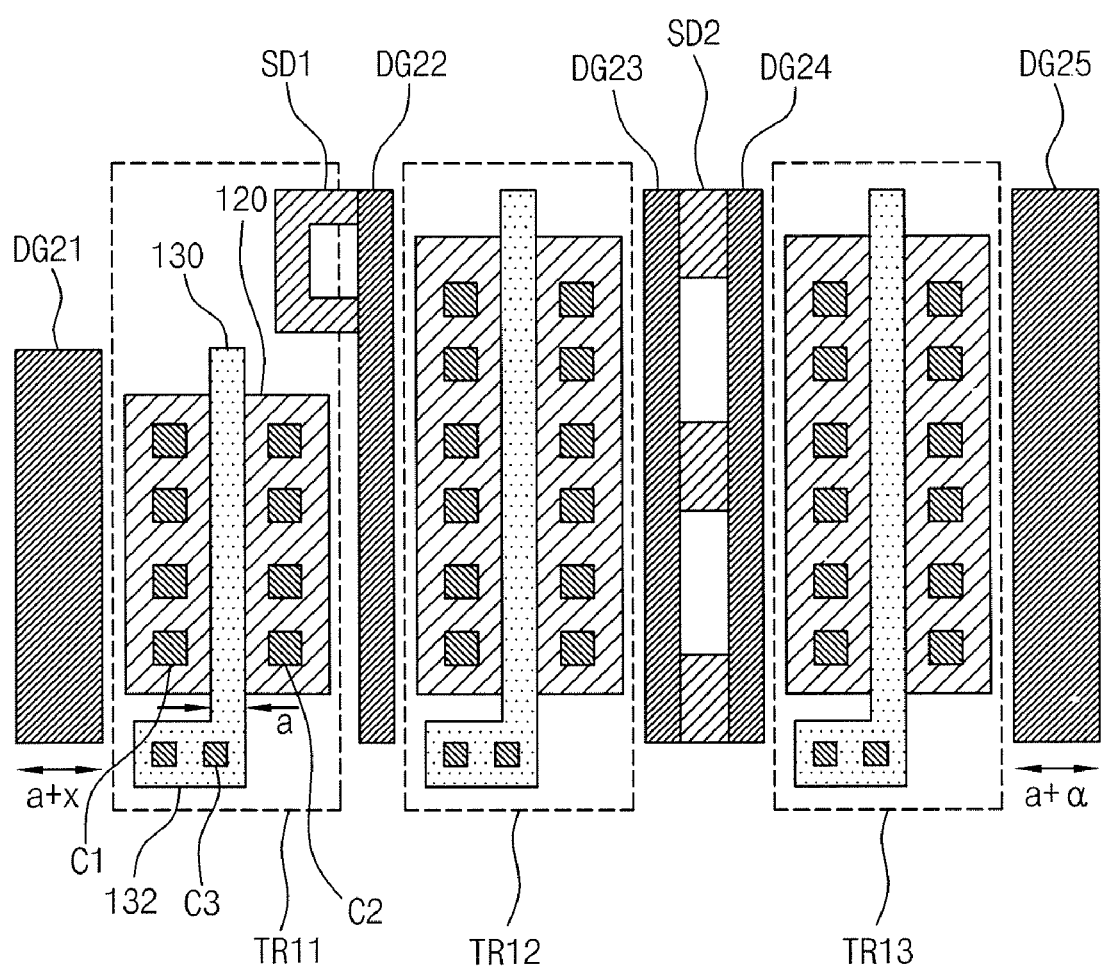
FIG. 11 is a layout diagram illustrating an embodiment of a dummy gate pattern of a semiconductor device according to the present invention.

Referring to FIG. 11, a transistor TR11 through a transistor TR13 are each formed in a different active region 120. Each of the transistors TR11 through TR13 is provided with a gate line 130 over the corresponding active region 120, and contacts C1 and C2 are formed over the active region 120 and divided into a source and drain on the basis of the gate line 130. Herein, the gate line 130 is formed as a bar type and has a gate pad 132 joined at an extended end of the gate line 130, and the gate pad 132 is formed integrally with the gate line 130. Also, contacts C3, which are connected with an upper metal line (not shown), are formed over the gate pad 132. Herein, the gate pad 132 also acts to structurally complement the gate line 130.

Further, FIG. 11 illustrates that the active regions of the adjacent transistors TR11 and TR12 have different sizes. In this case, the transistors TR11 and TR12 may have different driving forces according to the size of the corresponding active region.

A dummy gate pattern DG21 formed at a side of the transistor TR11, i.e., dummy gate pattern DG21 is one of the dummy gate patterns that is located at an outside area, and the dummy gate pattern DG21 is designed so as to have a width larger than that of the gate line 130 and thus is capable of preventing collapse. At this time, it is possible that the width a+x of the dummy gate pattern DG21 be designed to be less than a maximum width allowed in a designer's design specification. Further, a dummy gate pattern DG25 formed at a side of the transistor TR13 may also be designed to have a width wider than the width a of the gate line 130. The width a+α of the dummy gate pattern DG25 may be designed so as to be wider than the width of the dummy gate pattern DG21. This is done in order to compensate for the fact that the dummy gate pattern DG25 is weaker to collapse than the dummy gate pattern DG21 due to the length of the dummy gate pattern DG25 being longer than the length of the dummy gate pattern DG21.

Meanwhile, since the active region of the transistor TR12 is larger than the active region of the transistor TR11, a dummy gate pattern DG22 is formed between adjacent transistors TR11 and TR12. The dummy gate pattern DG22 has an auxiliary pattern SD1 that extends into a vacant space above a side region of the transistor TR11, and the auxiliary pattern SD1 forms a rectangular band with a longitudinal portion of the dummy gate pattern DG22, as shown in FIG. 11. However, the shape of the auxiliary pattern SD1 is not limited only to the rectangular band shape, and may instead be formed a number of various shapes that can structurally support the dummy gate pattern DG22 according to the manufacturer's intention.

As such, the auxiliary pattern SD1 is integrally formed with and extends from a side surface of an end of the dummy gate pattern DG22, and the auxiliary pattern SD1 works to stabilize the dummy gate pattern DG22.

Meanwhile, FIG. 11 also illustrates the adjacent transistors TR12 and TR13 having the same length, but spaced apart from each other farther than the transistor TR11 and the transistor TR12. Thus, two dummy gate patterns DG23 and DG24 are formed in the space between the transistors TR12 and TR13.

The two dummy gate patterns DG23 and DG24 include auxiliary patterns SD2 for structural support. The auxiliary patterns SD2 connect and are formed integrally with the two dummy gate patterns DG23 and DG24 in a space between the dummy gate patterns DG23 and DG24. The auxiliary patterns SD2 partially connect the dummy gate patterns DG23 and DG24. However, the auxiliary patterns SD2 can be implemented to not only partially connect the adjacent dummy gate patterns DG23 and DG24, but also to structurally complement the dummy gate patterns DG23 and DG24 in various manners including to integrally form the dummy gate patterns DG23 and DG24 according to a manufacturer's intentions.

As described above, the dummy gate patterns DG23 and DG24 are structurally complemented by the auxiliary patterns SD2 formed therebetween, and thus has increased stability from collapse.

Accordingly, in the present invention, various auxiliary patterns that can complement the side surface of the dummy gate pattern may be implemented. The gate pattern of the transistor can thus be optically and stably formed in an exposure process. Also, in the dummy gate pattern of the transistor, stability from collapse can be ensured since the side surface of the dummy gate pattern of the transistor is complemented by the auxiliary pattern.

Meanwhile, the present invention may be applied to make the distances between the gates of transistors, which are irregularly disposed in a leaf cell region, regular. Also, in the present invention the operation accuracy of the transistor can be enhanced when a dummy gate is disposed between the transistors to minimize variation in process deviation. As such, the critical region uniformity of the gate can be improved.

Figure 12:
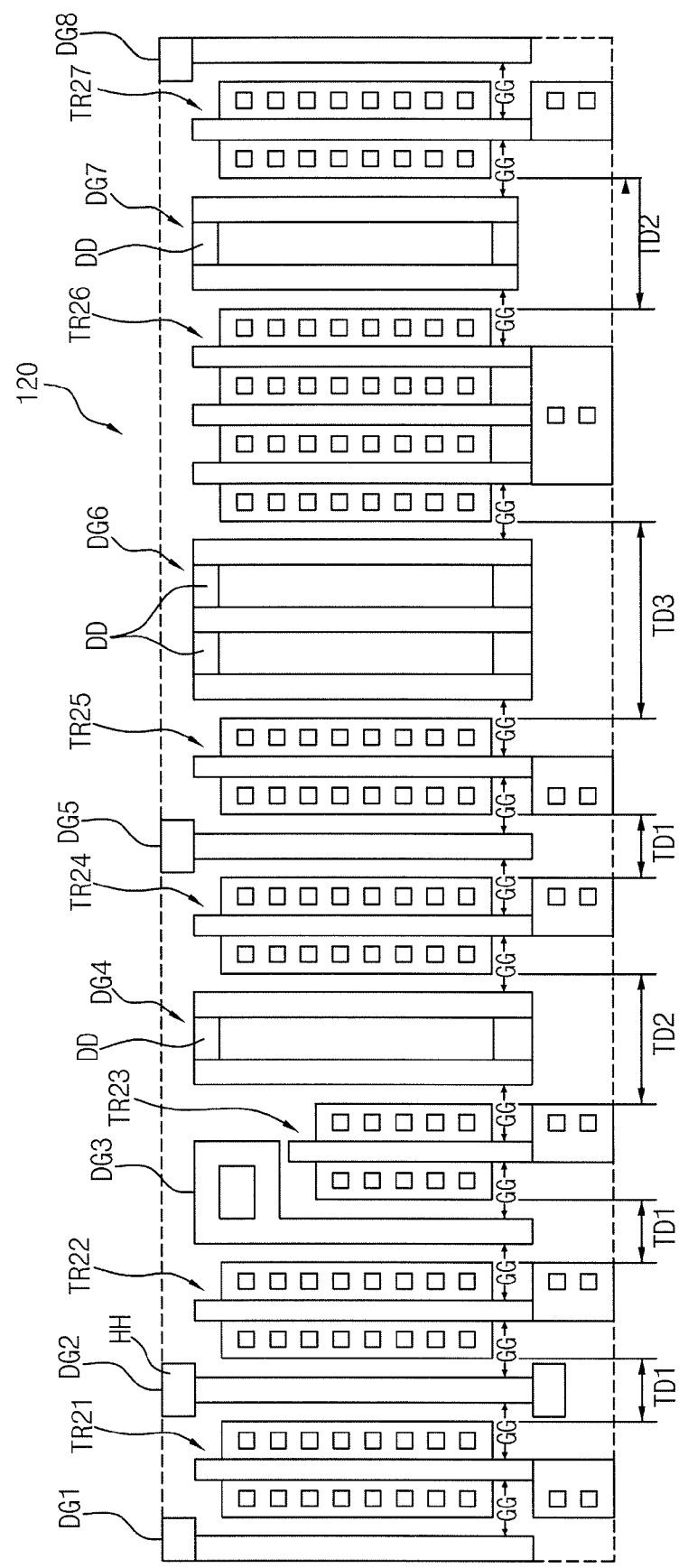
FIG. 12 is a layout diagram illustrating another embodiment of a dummy gate pattern of a semiconductor device according to the present invention.

Referring to FIG. 12, a semiconductor device according to an embodiment of the present invention is laid out in a leaf cell region 120 unit that performs at least one logical operation. In the leaf cell region 120, transistors TR21 through TR27 are irregularly disposed with a spacing larger than the minimum spaced distance TD1 (according to a design rule) between the transistors. After the layout of the leaf cell region 120, dummy gates DG1 through DG8, which correspond to the gates disposed at the edges of the transistors TR 21 through TR27, are disposed. These dummy gates DG1 through DG8 are disposed to reduce the variation in the process deviation of the gates disposed at the edges of the plurality of the transistors TR21 through TR27, and thus the dummy gates DG1 through DG8 maintain the critical region uniformity.

Herein, the dummy gates DG1 through DG8 may be formed of the same material used to form the gates G1 through G7 of the transistors TR21 through TR27.

Additionally, in order to minimize the variation in process deviation of the adjacent transistors TR21 through TR27, the dummy gates DG1 through DG8 are disposed so as to have the same spaced distance as that of the gates G1 through G7 of the transistors TR21 through TR27 regardless of the spaced distances TD1, TD2 and TD3 between the adjacent transistors TR21 through TR27.

Figure 13:
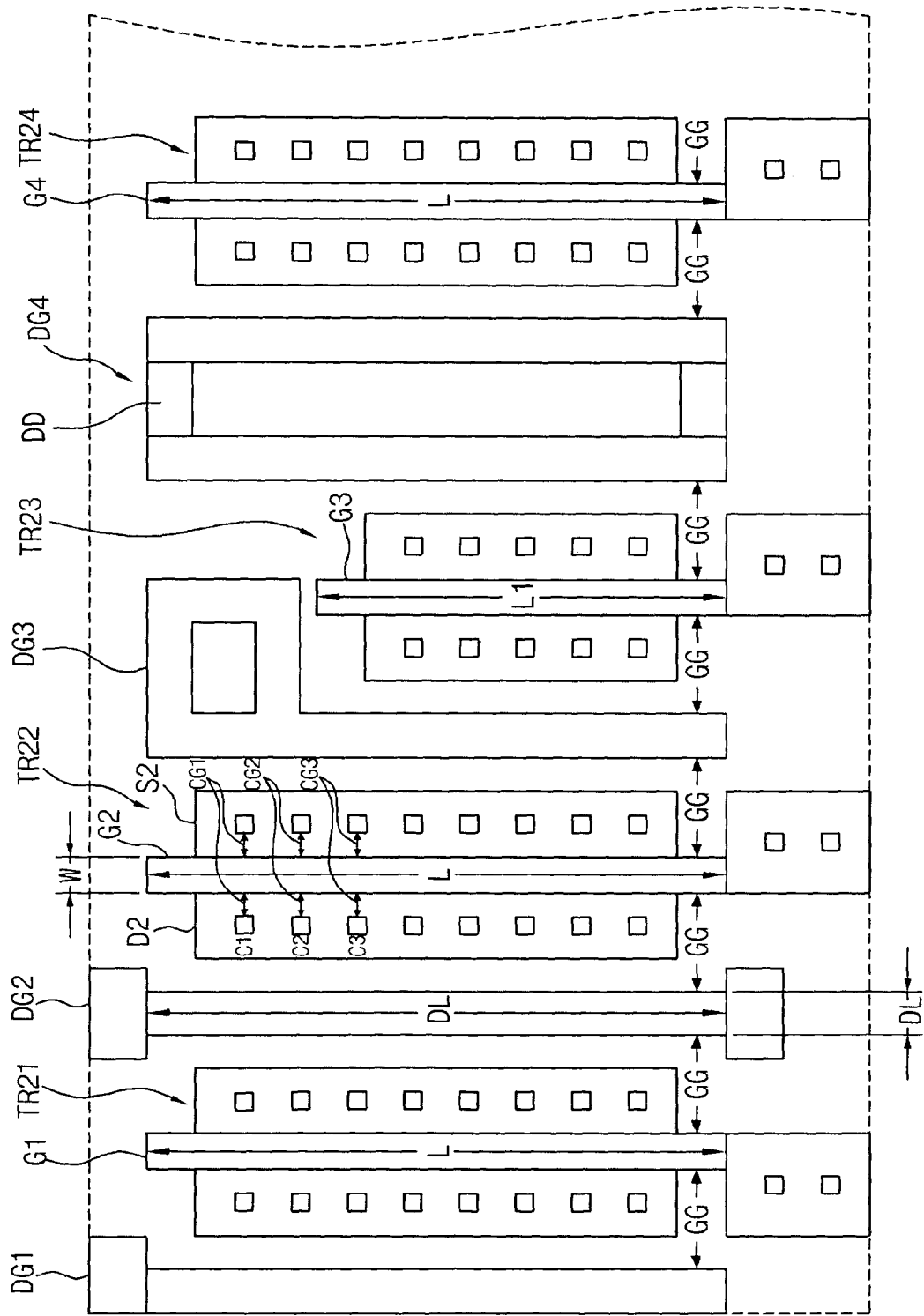
FIG. 13 is a partial enlarged view of FIG. 12.

For example, referring to FIG. 13, the dummy gate DG2 disposed between the transistors TR21 and TR 22 is disposed with spaced distances GG from edges of the gates G1 and G2 of the transistors TR21 and TR22 that are equal to the spaced distances GG between the dummy gate DG3 and the edges of the gates G2 and G3 of the transistors TR22 and TR 23.

Therefore, in the gate G2 of the transistor TR22, it is possible to minimize the variation in process deviation using the dummy gates DG2 and DG3, which are disposed at both sides of the gate G2 of the transistor TR22 and which have the same spaced distances GG. Thus the critical region uniformity is improved.

As a result, the distances from edges of respective metal contacts C1, C2 and C3, which are disposed in the drain region D2 and the source region S2 of the transistor TR22, to an edge of the gate G2 become the same, and the current flowing through the gate G2 becomes the same. Therefore, the transistor can operate according to a designer's intentions.

Meanwhile, the dummy gates DG1 through DG8 have a length DL which is at least larger than the length L of the gates G1 through G7 of the transistors TR21 and TR27 in consideration of the process deviation.

Further, lengths DW of the dummy gates DG1 through DG8 are the same as the length L of the gate of the transistor. If lengths L and L1 of the gates of the adjacent transistors are different, the lengths DW correspond to the length L of the gate, which is relatively longer.

For example, the length DL of the dummy gate DG3, which is disposed between the transistors having lengths L and L1, corresponds to the relatively longer length L of the gate of the transistor TR22 This is done to satisfy the critical uniformity of the gates G2 and G3 of both transistors TR22 and TR23.

Also, shapes of the dummy gates DG1 through DG8 may be determined according to the spaced distances TD1, TD2, and TD3 between the adjacent transistors TR21 through TR27 (refer to FIG. 12 for spaced distances TD1, TD2, and TD3 that correspond to FIG. 13).

The shapes of the dummy gates DG1 through DG8 will now be described specifically with reference to FIG. 12. A minimum spaced distance TD1 (according to a design rule) exists between the corresponding transistors of the transistors TR21 through TR27, and the spaced distances TD2 and TD3 between the corresponding transistors of the transistors TR21 through TR27 have a larger value than the minimum spacing TD1 according to the design rule.

Regardless of the spaced distances TD1, TD2, or TD3 between the transistors TR21 through TR27, the spaced distances GG between the dummy gates DG1 through DG8 and the edge of the gates of the adjacent transistor are the same.

Therefore, in a case where the spacing between the adjacent transistors TR21 through TR27 is the minimum spaced distance TD1 between the transistors according to the design rule; i.e. the dummy gates DG1 and DG8 disposed between the edges of the leaf cell region 120 and the opposing transistors TR21 and TR27, and the dummy gates DG2, DG3, and DG5 disposed between the transistors TR21 and TR22, TR22 and TR23, and TR24 and TR25 respectively; have a bar shape that is parallel to the gate of the adjacent transistor.

Herein, the dummy gates DG1 and DG8 may have a different shape in consideration of the transistor (not shown) that is opposite to the edge of the adjacent leaf cell region (not shown).

Additionally, in a case where the spaced distance TD2 or TD3 between the adjacent transistors TR21 through TR27 is larger than the minimum spaced distance TD1 between the transistors according to the design rule; i.e. the dummy gates DG4, DG6, and DG7 disposed between the transistors TR23 and TR24, TR25 and TR26, and TR26 and TR27 respectively; the dummy gates are formed in a rectangular shape having bar shaped dummy gates corresponding to the adjacent transistors, i.e. TR23 and TR24, TR25 and TR26, and TR26 and TR27, and a connecting pattern DD that connects the ends of the bar shaped dummy gates. The rectangular dummy gate DG6 may further include a bar shaped dummy gate that divides the inside of the rectangle in a longitudinal direction L parallel to the gate.

Meanwhile, the aforementioned dummy gates DG1 through DG8 should be disposed in a self supportable structure since the dummy gates DG1 through DG8 are in a floating state. The rectangular dummy gates DG4, DG6, and DG7 are in a stable supporting structure, but the bar shaped dummy gates DG1, DG2, DG3, DG5, and DG8 may require further supporting structures.

Therefore, the bar shaped dummy gates DG1, DG2, DG3, DG5, and DG8 may be formed with a rectangular hammer head HH at least one end thereof.

The dummy gates DG1 through DG7 are made of the same material as the gates G1 through G7 of the transistors TR21 through TR27. The hammer head HH should not overlap the input pads (not shown) of the gates G1 through G7 so that the spacing condition of the dummy gates DG1 through DG7 and the gates G1 through G7 is satisfied.

Further, the bar shaped dummy gate DG3 is formed to include a rectangular shape that extends toward the transistor TR3 having relatively short gate having the length L1, In dummy gate DG3 the extending rectangular shape may be used as a supporting structure instead of the hammer head.

Additionally, the bar shaped dummy gates DG1 and DG8 may have a rectangular hammer head HH that asymmetrically extends in one direction toward an inside of the leaf cell region 120.

As such, in the present invention since the dummy gates are disposed to have uniform distances from the adjacent gates (which are disposed at the edge of the transistors that are irregularly disposed in the leaf cell region), the critical region uniformity of the gate is enhanced, and thus variation in process deviation is minimized, thereby improving the operation accuracy of the transistor.

Meanwhile, the present invention may be applied to a metal line pattern forming method and is formed with: a power metal line pattern that supplies power, a signal metal line pattern that transfers a signal, and a dummy metal line pattern disposed between the power metal line pattern and the signal metal line pattern to enhance uniformity of a pattern.

Figure 14:
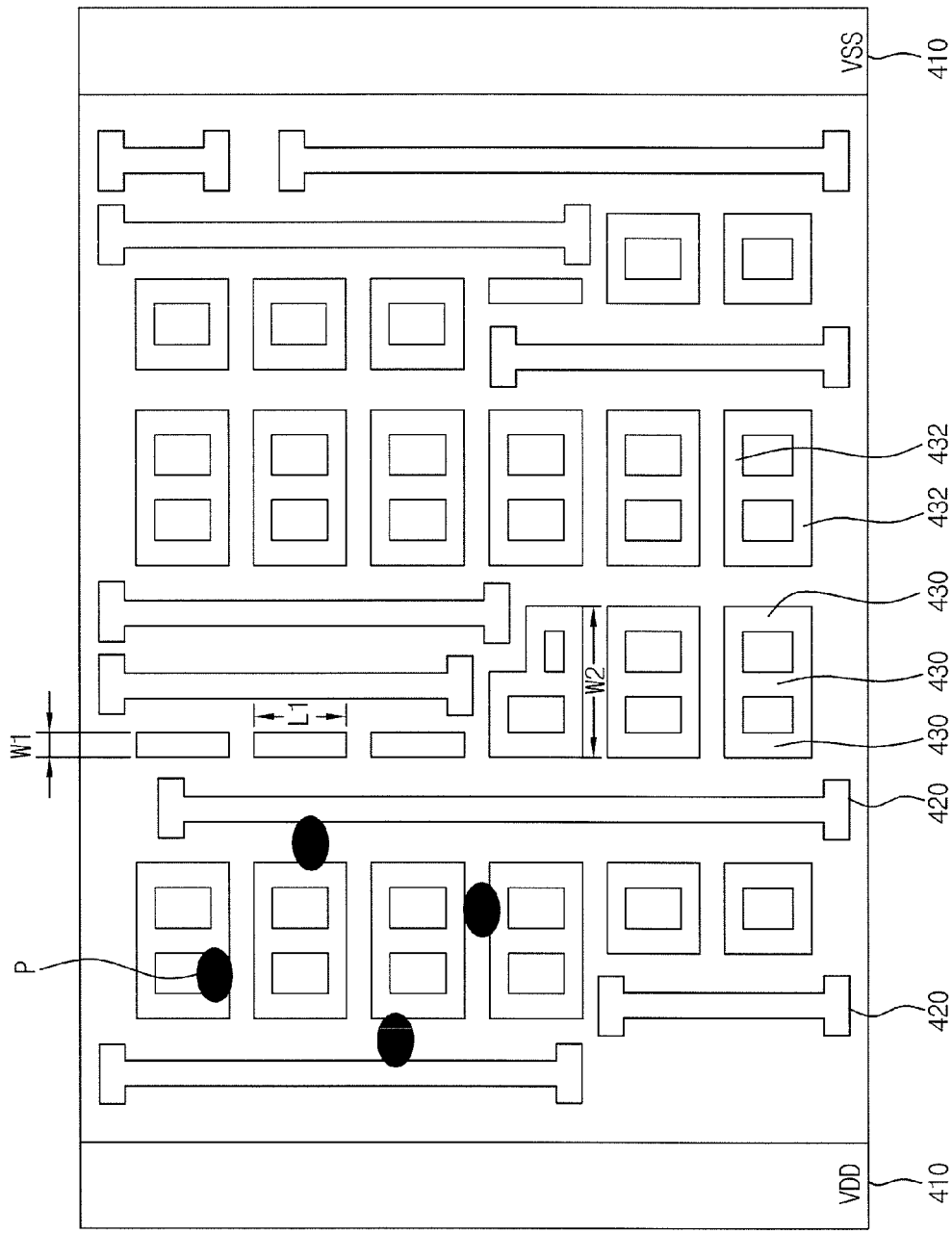
FIG. 14 is a layout diagram illustrating a method of forming a metal line according to the present invention.
Figure 15:
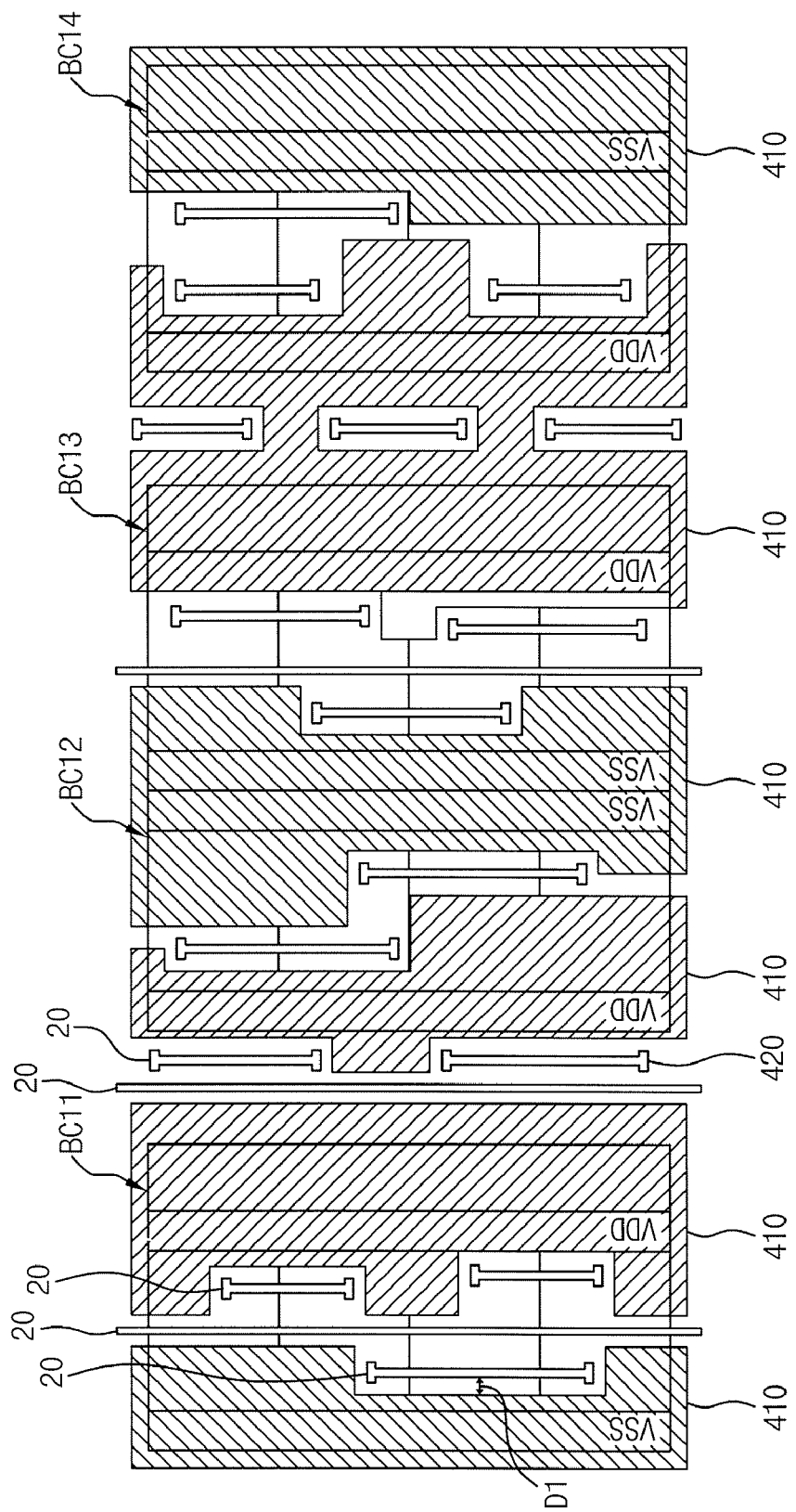
FIG. 15 is a layout diagram illustrating another embodiment of a method of forming a metal line according to the present invention.

Referring to FIGS. 14 and 15, a semiconductor memory is provided with a plurality of block cells BC11 through BC14 formed by a gathering of unit cells in a peripheral region. In each block cell BC11 through BC14, power metal line patterns 410, which supply a power voltage VDD and a ground voltage VSS, are disposed in parallel to each other, and signal metal line patterns 420, which transfer a routing signal between the block cells, are irregularly disposed between the power metal line patterns 410. Also, at least two dummy metal line patterns 430, which are electrically divided in at least one direction, are disposed between the signal metal line patterns 420.

Herein, the power metal line pattern 410 may be expanded, as shown in FIG. 15, in a direction of the signal metal line pattern 420 with a spaced distance D1 from the signal metal line pattern 420. The spaced distance D1 minimizes a coupling effect.

Also, as shown in FIG. 15, the power metal line pattern 410 may be constructed so as to incorporate another adjacent power metal line pattern 410 which supplies the same power as shown.

As such, since the power metal line pattern 410 is expanded in the direction of the signal metal line pattern 420 and is formed so as to incorporate another adjacent power metal line pattern 410 which supplies the same power, it is possible to increase the size of the power metal line pattern 410, which has been decreased with high integration, and supply stable power.

Meanwhile, the dummy metal line pattern 430 is divided in the direction of the signal metal line pattern 420 as shown in FIG. 14. The divided dummy metal line pattern 430 is formed in a bar type with a predetermined width W1, which is defined in the design rules according to the technology, and a length L1 not larger than the predetermined maximum dividing length of the applied technology field.

Also, the dummy metal line patterns 430 are expanded in the direction perpendicular to the longitudinal direction of the signal metal line pattern 420. For example, when a dummy metal line pattern 430 is adjacent to another dummy metal line pattern 430, an auxiliary dummy metal line pattern 432 is disposed to connect and support the two adjacent dummy metal line patterns 430.

Preferably, a width W2 of the auxiliary dummy metal line patterns 432 is not larger than the predetermined maximum expanding width of the applied technology field.

In other words, the dummy metal line pattern 430 forms a polygon when the auxiliary dummy metal line patterns 432 are connected to both ends thereof and there exists a rectangular vacant space.

As such, since the dummy metal line pattern 430 is parallel to the signal metal line pattern 420 and is disposed so as to be divided, the chance of a defect occurring wherein a short is created between different metal line patterns 410 and 420 due to the dummy metal line patterns 430 is reduced even when a particle P is generated in the process as shown in FIG. 14.

Also, since the length L1 of the dummy metal line pattern 430 is shorter than the prior art, it is easy to stably form the dummy metal line pattern 430 even when the width W1 is decreased. In addition, the dummy metal line pattern 430 can be more stably supported due to the auxiliary metal line pattern 432 disposed at an end of the dummy metal line pattern 430.

As described above, the density difference in the metal line patterns is reduced by expanding the power metal line pattern 410 into the space between the power metal line pattern 410 and the signal metal line pattern 420, and by disposing the dummy metal line pattern 430 (which is divided and is thus stable) in the space between the signal metal line patterns 420. Therefore, in the present invention, the step of forming an oxide layer is reduced in the chemical mechanical polishing process that is used to reduce the dishing phenomenon, and thus uniformity of the metal line pattern can be improved.

Additionally, the present invention may have a structure wherein a MOS transistor pair requiring the same electric characteristics (such as a differential pair or a current mirror structure) can be formed symmetrically with respect to a predetermined reference line of the substrate, and a gate dummy pattern, having various shapes that are capable of minimizing an influence of the adjacent MOS transistor, can be formed at both sides of each MOS transistor.

Figure 16:
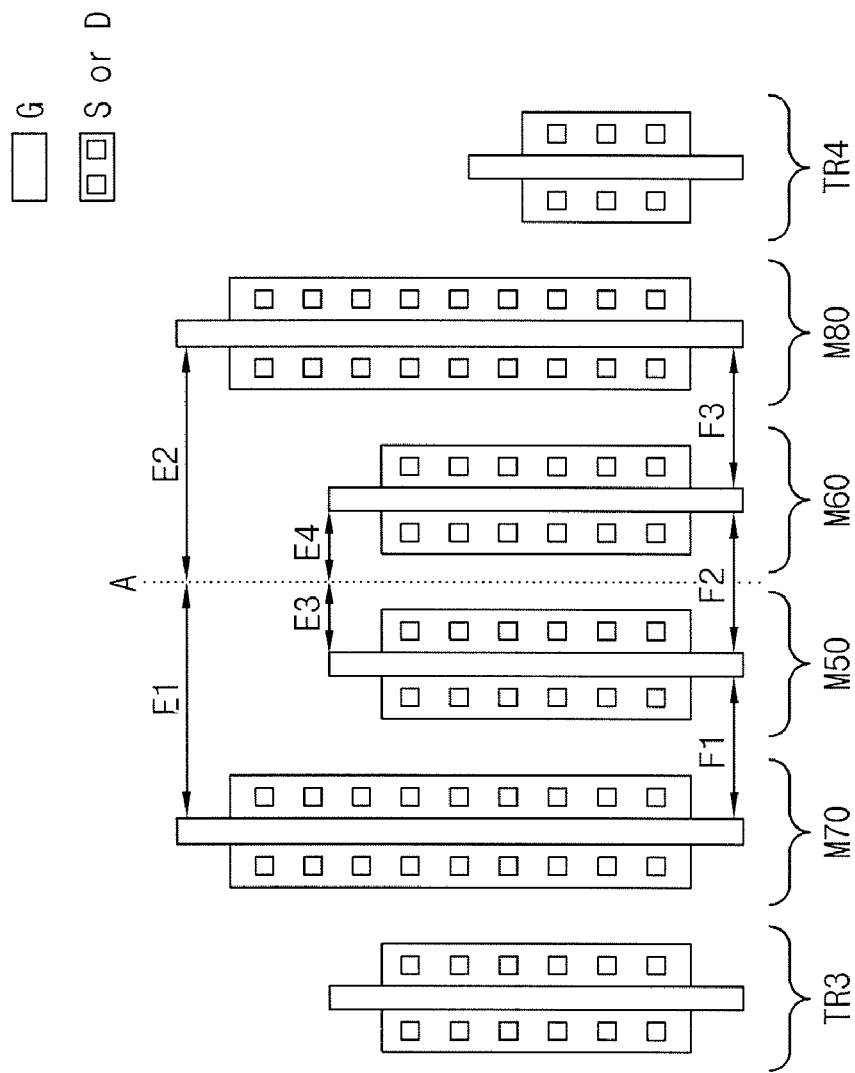
FIG. 16 is a view illustrating an embodiment of a layout structure of a semiconductor device according to the present invention.

Specifically, referring to FIG. 16, a semiconductor device of an embodiment of the present invention includes, a MOS transistor pair <M50, M60> disposed adjacently and formed symmetrically with respect to a predetermined reference line A of a substrate; at least one MOS transistor pair <M70, M80> formed symmetrically with respect to the reference line A, and MOS transistors TR3 and TR4 formed at the outsides of the MOS transistor pair <M70, M80>. Herein, the MOS transistors M50, M60, M70, and M80 have a structure that includes a gate G and a source and a drain regions S and D that are formed on both sides of the gate G.

Further, it is preferable that a spacing E1 between the MOS transistor M70 and the reference line A and a spacing E2 between the MOS transistor M80 and the reference line A are the same. Also, it is preferable that a spacing E3 between the MOS transistor M50 and the reference line A and a spacing E4 between the MOS transistor M60 and the reference line A are the same. It is also preferable that spacings F1, F2, and F3 between the gates of the MOS transistors M50, M60, M70, and M80 are the same.

Figure 1A:
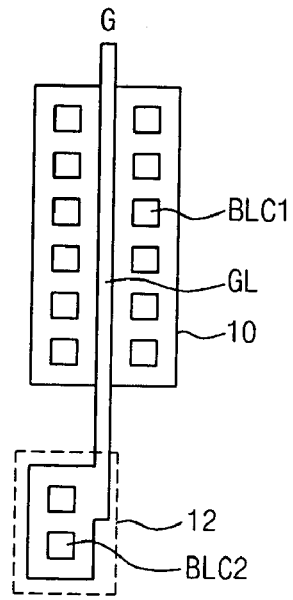
FIG. 1A is a view showing a layout of a semiconductor device according to the prior art.
Figure 1B:
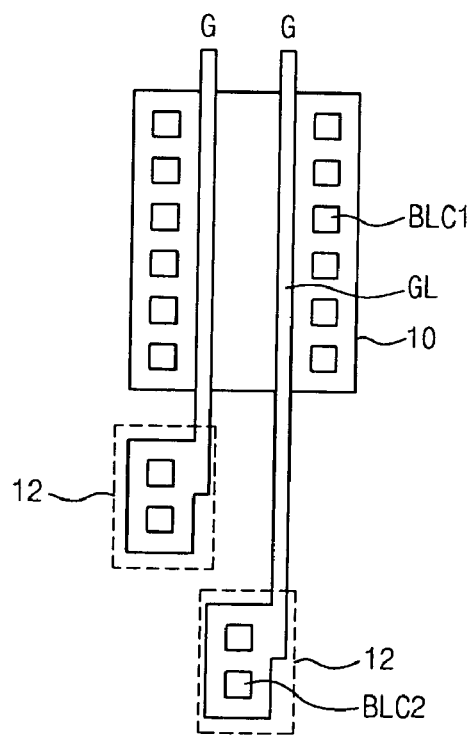
FIGS. 1B and 1C are views showing a layout of a semiconductor device having at least two gates according to the prior art.
Figure 1C:
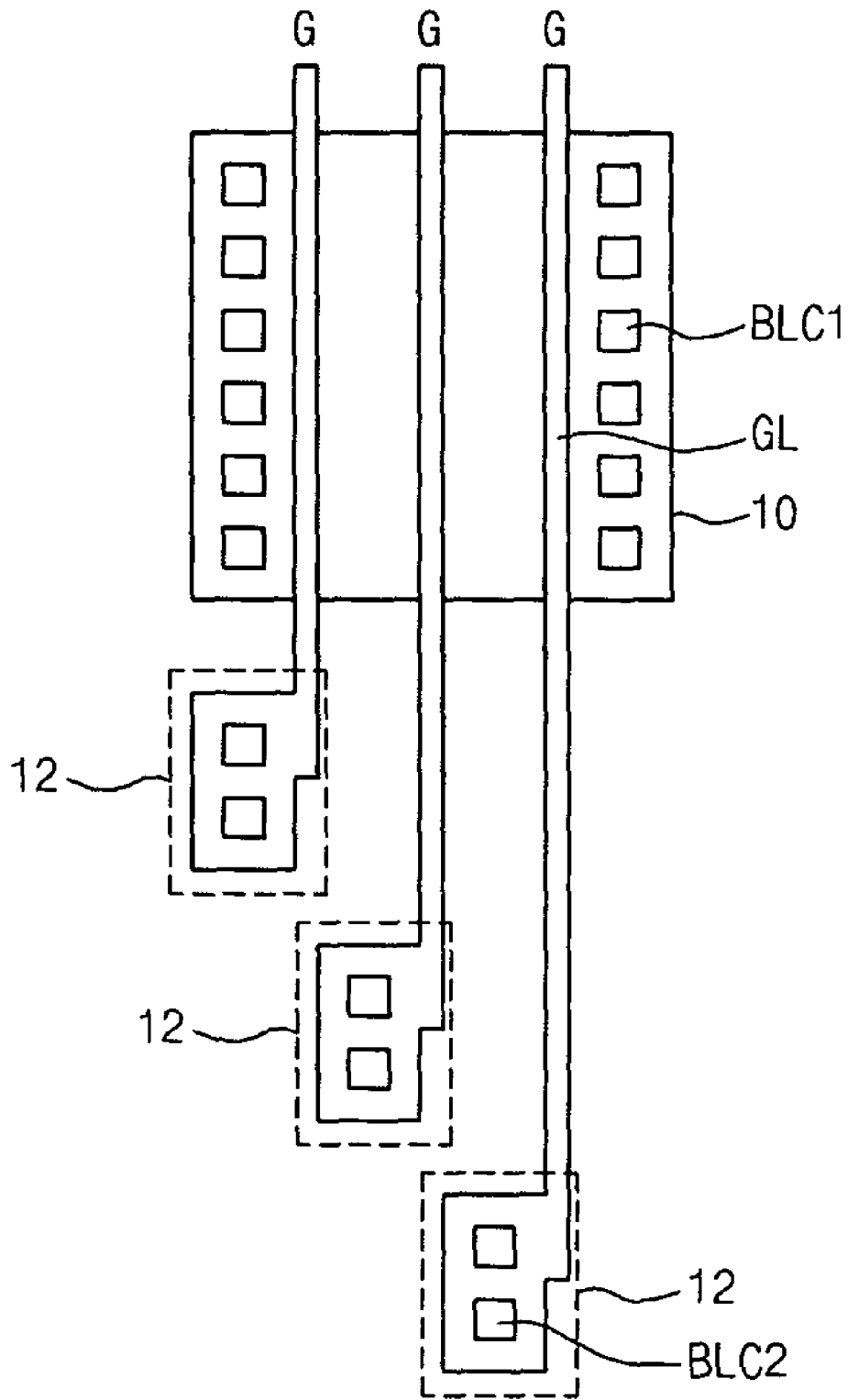
Figure 2:
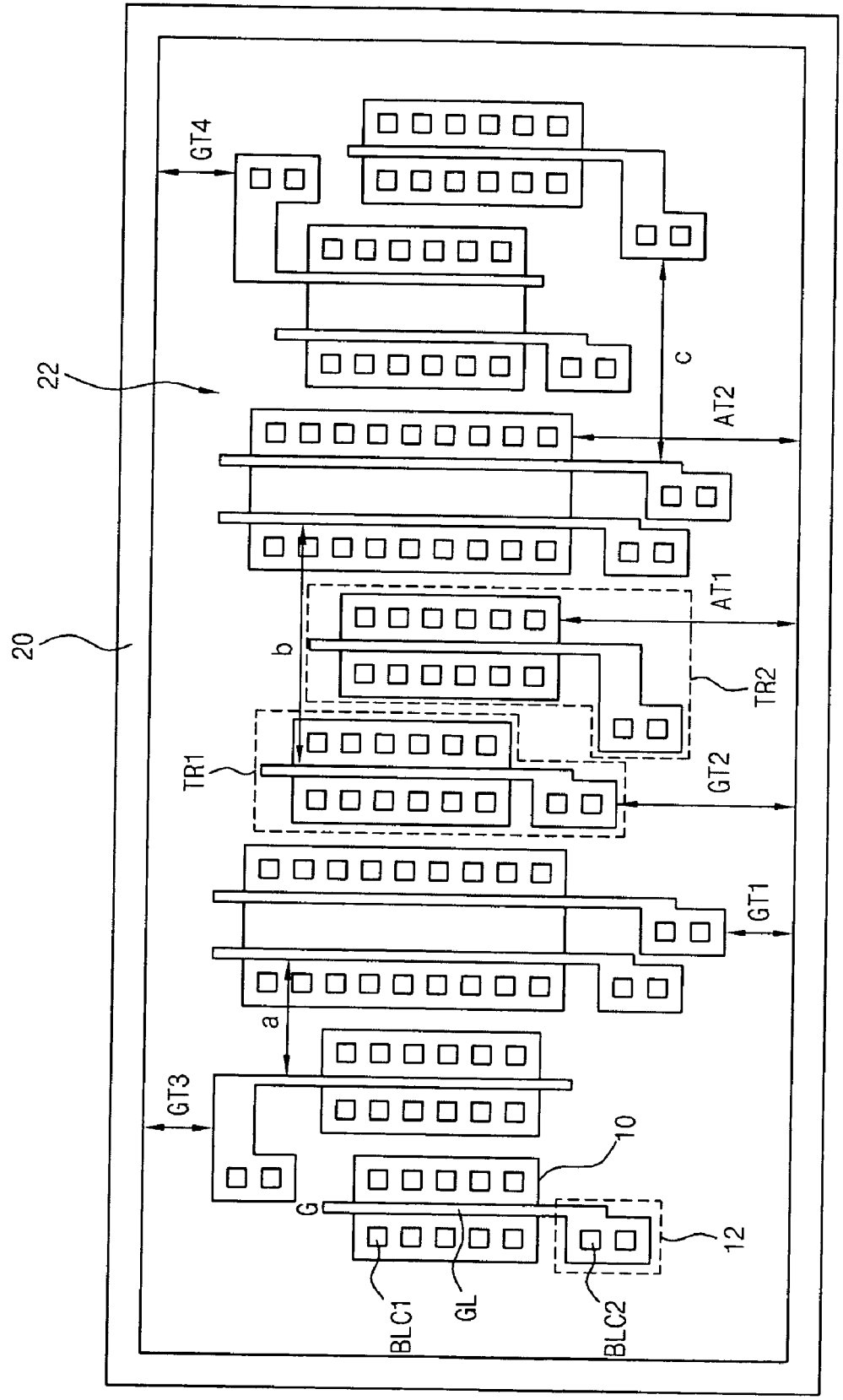
FIG. 2 is a view showing a layout of a semiconductor device including MOS transistors according to the prior art.
Figure 3:
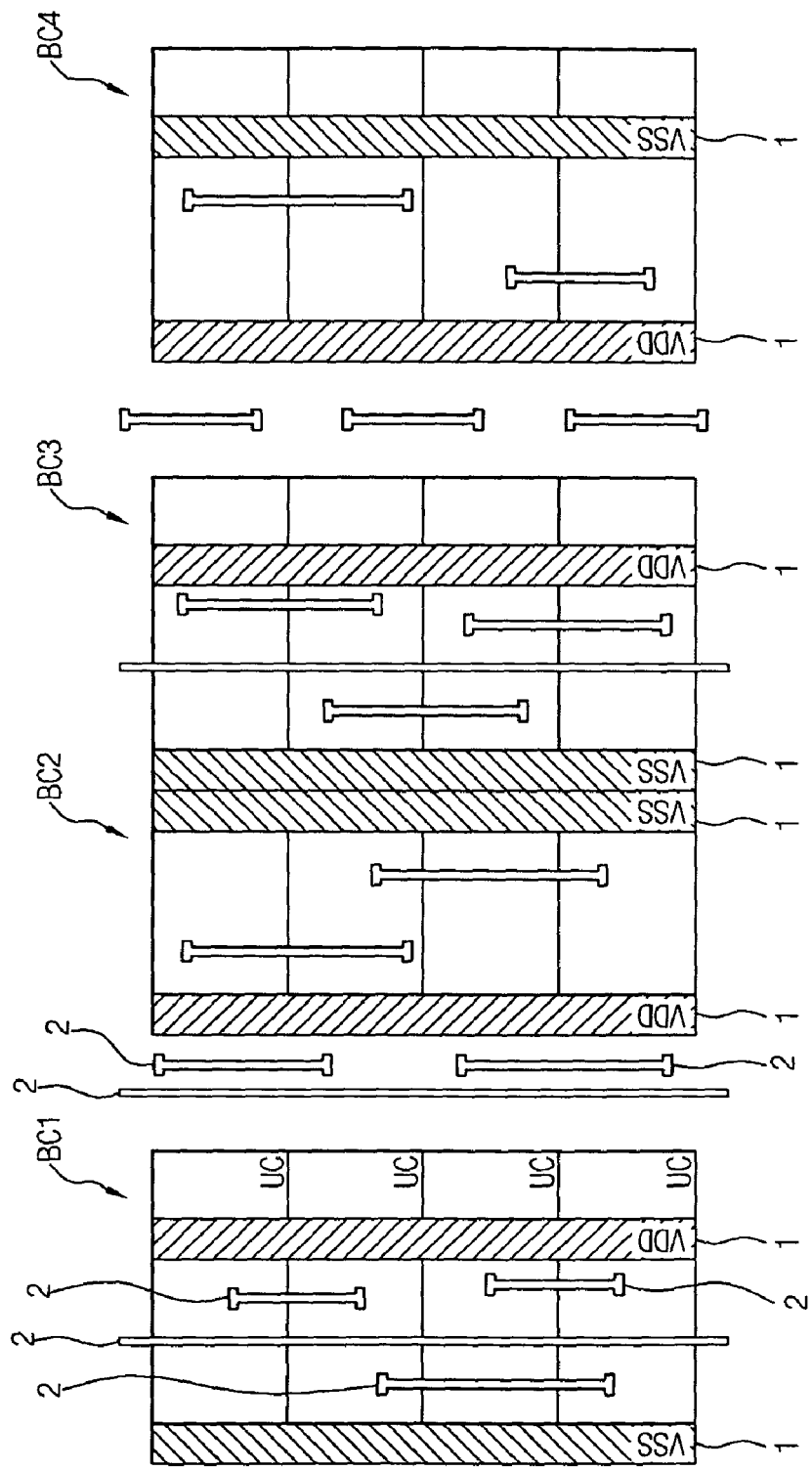
FIG. 3 is a layout diagram illustrating a method of forming a metal line pattern according to the prior art.
Figure 4:
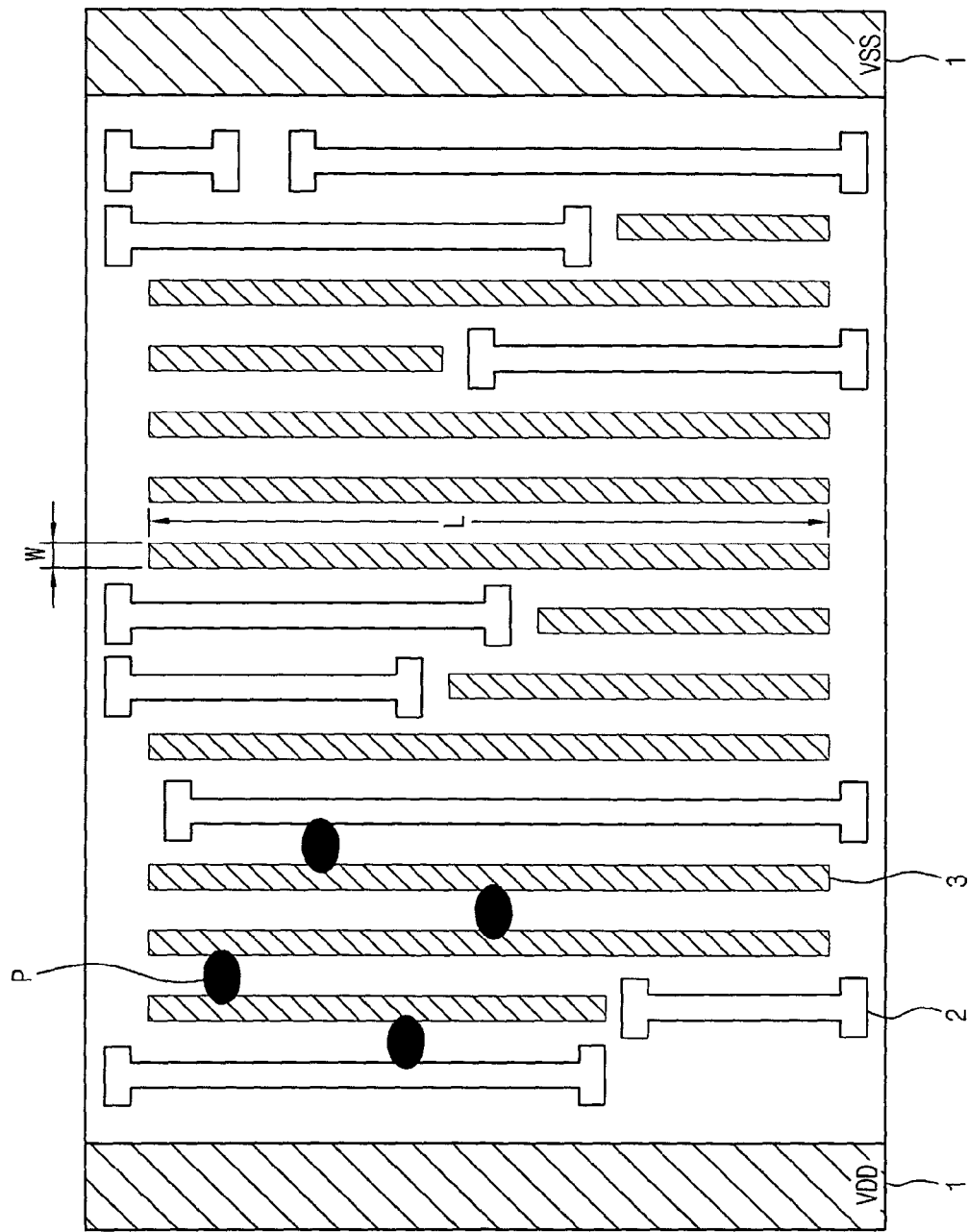
FIG. 4 is a layout diagram enlarging a space between the metal line patterns of FIG. 3.
Figure 5:
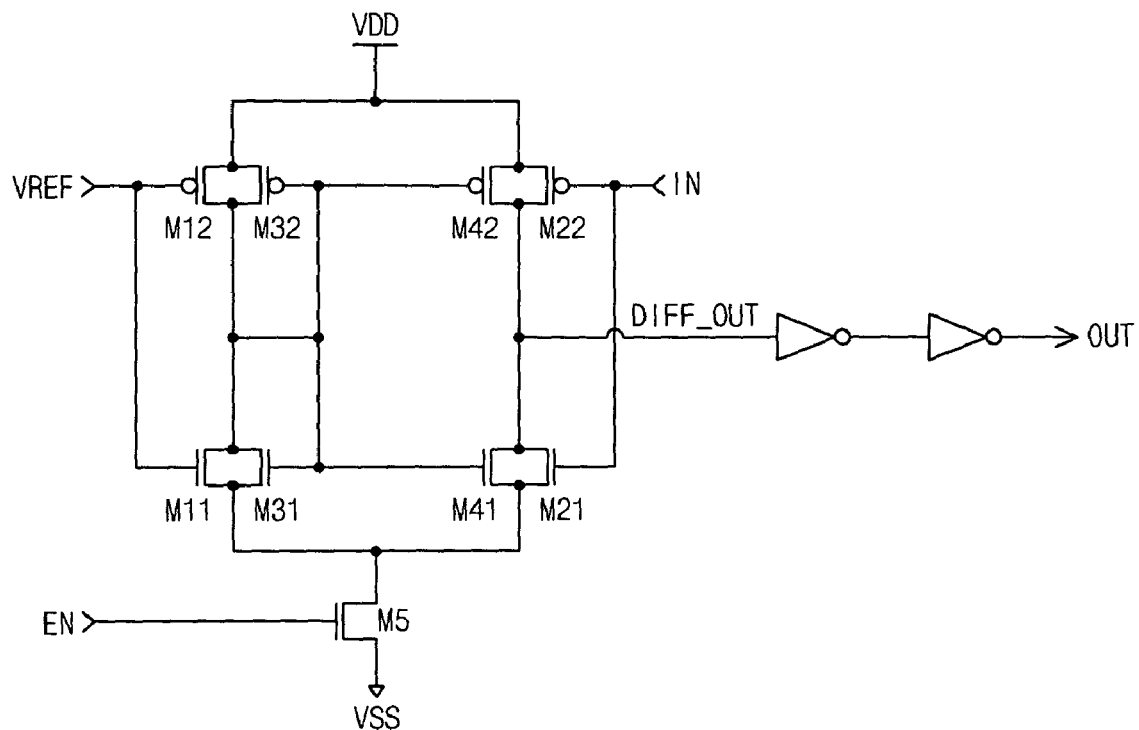
FIG. 5 is a circuit diagram showing a general quad coupled receiver type input/output buffer.
Figure 6:
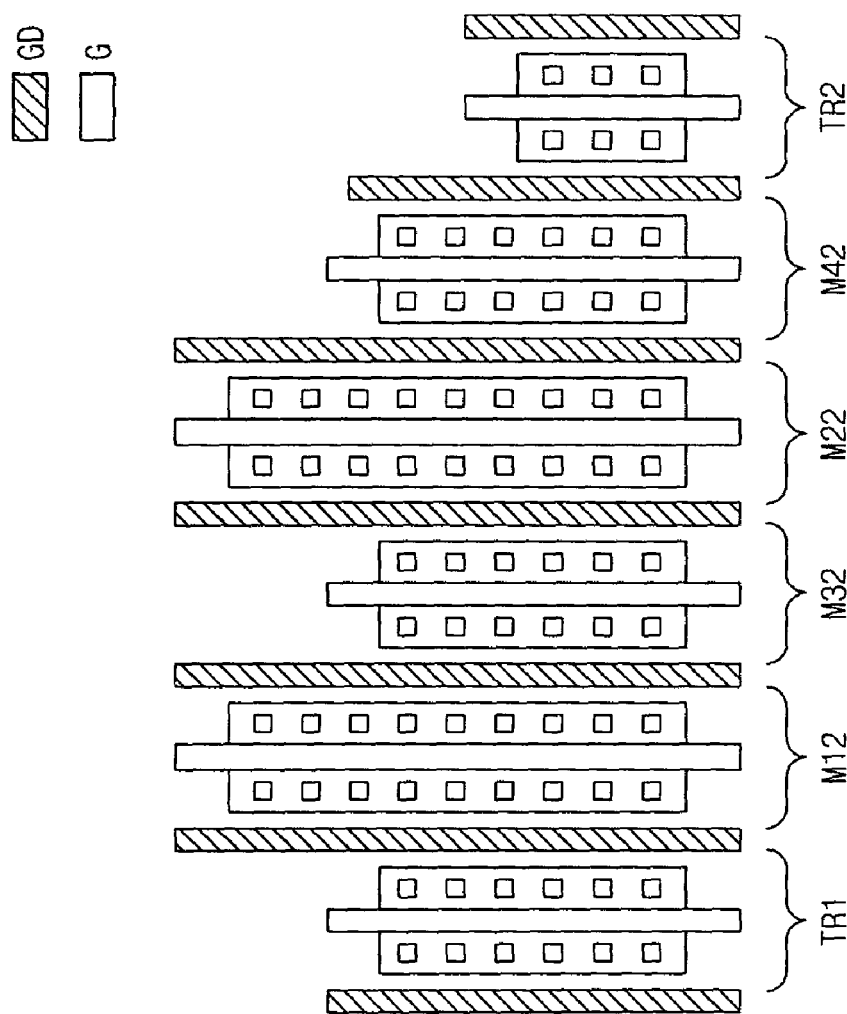
FIG. 6 is a layout diagram of FIG. 5.

The MOS transistor pair <M50, M60> includes two MOS transistors M50 and M60 that require the same electric characteristics and have the same size. For example, referring to FIG. 5 in conjunction with FIG. 16, the MOS transistor pair <M50, M60> can be made up of two PMOS transistors M32 and M42 having the current mirror structure that provides same currents to the nodes ND1 and ND2 due to the electric potential formed at the node ND1 to which the drain terminals of the two PMOS transistors M12 and M32 and two NMOS transistors M11 and M31 are connected. In other words, the MOS transistor pair <M50, M60> can provide the two NMOS transistors M31 and M41 having the current mirror structure that provides same currents to the nodes ND1 and ND2 and the common node CND due to the electric potential at the node ND1. Alternately, the MOS transistor pair <M50, M60> may includes two NMOS transistors M31 and M41 of the current mirror structure that provide a same current that flows between the nodes ND1 and ND2 and the common node CND due to the electric potential of the node ND1.

Further, the MOS transistor pair <M70, M80> includes two MOS transistors M70 and M80 that require the same electric characteristics and have the same size. For example, the MOS transistor pair <M70, M80> may include two PMOS transistors M12 and M22 that pull up the nodes ND1 and ND2 to the level of the power voltage VDD due to a reference voltage VREF and input signal IN. Alternately, the MOS transistor pair <M70, M80> may include two NMOS transistors M11 and M21 that pull down the nodes ND1 and ND2 to the level of the common node CND due to a reference voltage VREF and input signal IN.

The MOS transistors TR3 and TR4 respectively formed adjacent to the outside of the MOS transistor pair <M70, M80> are not required to have the same electric characteristics and may be one of a NMOS transistor M5, MOS transistors constructing an inverter INV1, and MOS transistors constructing an inverter INV2 respectively.

As such, the semiconductor device according to an embodiment of the present invention has a structure wherein each of the MOS transistor pairs <M50, M60> and <M70, M80>, require the same electric characteristics and are formed symmetrically with respect to the predetermined reference line A of the substrate.

In the layout structure just described, conditions of the MOS transistors M60 and M70 disposed on both sides of the MOS transistor M50 are as the same, and conditions of the MOS transistors M50 and M80 disposed on both sides of the MOS transistor M60 are the same. As such, the MOS transistors of the MOS transistor pair <M50, M60> are subject to the same influences during the manufacturing process, and thus have the same electric characteristics.

Further, the semiconductor device according to an embodiment of the present invention has a structure wherein the MOS transistor pair <M50 M60> (which has the relatively smaller length) is disposed adjacent to the reference line A, and the MOS transistor pair <M70 M80> (which has the relatively larger length) is disposed so as to surround the MOS transistor pair M50 and M60.

In this case, since both side surfaces of the gate of the MOS transistors (for example, M50) are subject to influences due to the adjacent MOS transistor pair (in this example <M60 and M70>) during the manufacturing process, variation in the gate critical dimension of the MOS transistor pair M50 and M60 can be minimized during the manufacturing process.

Figure 17:
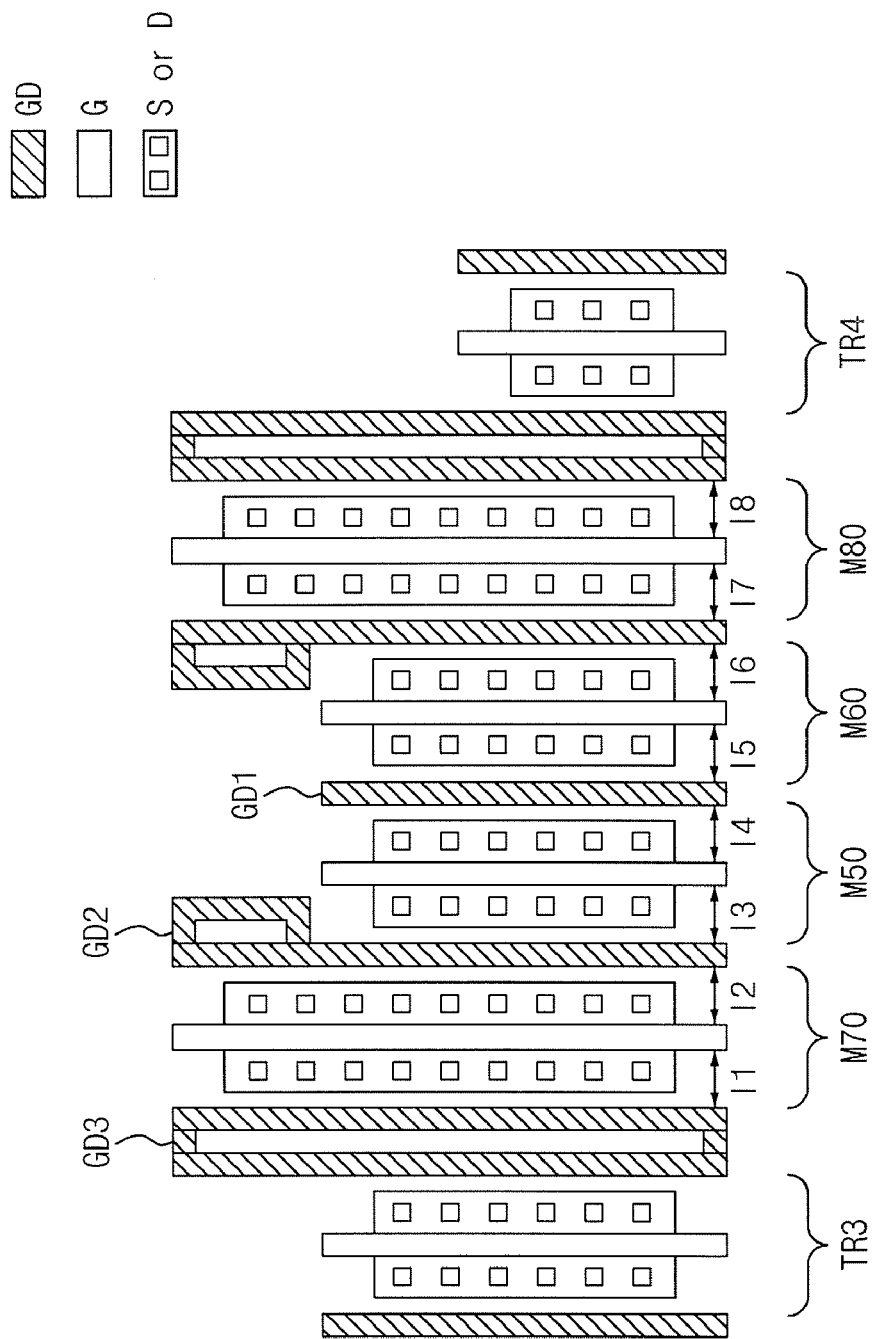
FIGS. 17 through 19 are views illustrating other embodiments of a layout structure of a semiconductor device according to the present invention.

In another embodiment of the present invention, FIG. 17 shows a structure wherein gate dummy patterns GD are formed on both sides of the each MOS transistor M50, M60, M70, and M80 in the layout structure of FIG. 16.

Referring to FIG. 17, the MOS transistor pairs <M50, M60> and <M70, M80> (each MOS transistor in a MOS transistor pair requiring the same electric characteristics) are symmetrically formed with respect to a predetermined reference line A. The gate dummy patterns GD are formed on both sides of each MOS transistor M50, M60, M70, and M80. Herein, it is preferable that spacings 11 through 18, which is the spacing between the gate G and the gate dummy GD, are all uniform.

A bar shaped gate dummy GD1 having the same length as the gates G of the MOS transistors M50 and M60 is formed between the MOS transistor pair M50 and M60.

Additionally, a gate dummy pattern GD2 having the same length as the gate G of the MOS transistor M70 may be formed between the MOS transistor M50 and the MOS transistor M70. The same gate dummy pattern GD2 may also be formed between the MOS transistor M60 and the MOS transistor M80.

At this time, the gate dummy pattern GD2 has a shape wherein a main gate dummy has a length corresponding to the length of the relatively larger gates of MOS transistors M70 and M80 and an auxiliary gate dummy is formed in a vacant space corresponding to a side of the MOS transistors M50 and M60 that have the relatively smaller gate length. The main gate dummy and the auxiliary gate dummy are connected using a coupling part, thus completing the structure of the gate dummy pattern GD2. The auxiliary gate dummy has a length equal to a value obtained by subtracting the length of the gate G of the MOS transistors M50 and M60 from the length of the gate G of the MOS transistors M70 and M80. The coupling part is a dummy pattern connecting the ends of the auxiliary gate dummy to the main gate dummy.

In addition, a gate dummy pattern GD3 having the same length as the gate G of the MOS transistor pair <M70 M80> may be formed on the sides of the MOS transistor pair M70 and M80, i.e. between the MOS transistor M70 and a MOS transistor TR3 and between the MOS transistor M80 and a MOS transistor TR4.

At this time, the gate dummy pattern GD3 has a structure wherein two gate dummies having the same length as the gate G of the MOS transistor pair M70 and M80 are formed parallel to each other and integrated using a coupling part. It is preferable that the coupling part connect the sides ends of the gate dummies, such that the gate dummy pattern GD3 has a rectangular structure.

In the just described embodiment of the present invention, when the gate dummies are formed at both sides of each MOS transistor M50, M60, M70, and M80, it is possible to effectively prevent a diminishment in the electric characteristics of each MOS transistor M50, M60, M70, and M80 during the manufacturing process.

Additionally, since such gate dummies formed on the sides of each MOS transistor in a MOS transistor pair are the same, the MOS transistors can have the same electric characteristics.

Particularly, in a case where a MOS transistor (for example, M70) having a large length and a MOS transistor (for example, M50) having a small length are adjacent, a ring shaped gate dummy pattern GD2, which has a bar shaped main gate dummy and an auxiliary gate dummy connected to the main gate dummy via the coupling parts (which protrudes into a space unoccupied by the MOS transistor M50 due to its a small length) is formed between the MOS transistors M50 and M70.

In this case, a part of the gate G of a MOS transistor (for example, M70) having a large length is influenced by the main gate dummy of the gate dummy pattern GD2 and the gate G of the MOS transistor (for example, M50) having a small width. The rest of the gate G of the MOS transistor (for example, M70) is influenced by the main gate dummy and the auxiliary gate dummy of the gate dummy pattern GD2 during the manufacturing process. As such, the gate of the MOS transistor pair M70 and M80 having a large length can be formed without deflection due to a gate deflection phenomenon.

Further, in a case where two MOS transistors TR3 and TR4 having different lengths are disposed at the outside of the MOS transistors in the MOS transistor pair M70 and M80 (which have large lengths) gate dummy patterns GD3 including two gate dummies having the same length as the gate of the MOS transistors in the MOS transistor pair M70 and M80 may be disposed between the MOS transistor M70 and the MOS transistor TR3 and between the MOS transistor M80 and the MOS transistor TR4.

The influence from the MOS transistors TR3 and TR4 on the gate G of the MOS transistor pair M70 and M80 is reduced due to the gate dummy pattern GD3, and thus the other side of the gate G of the MOS transistor pair M70 and M80 can be uniformly formed without deflection due to a gate deflection phenomenon.

Figure 18:
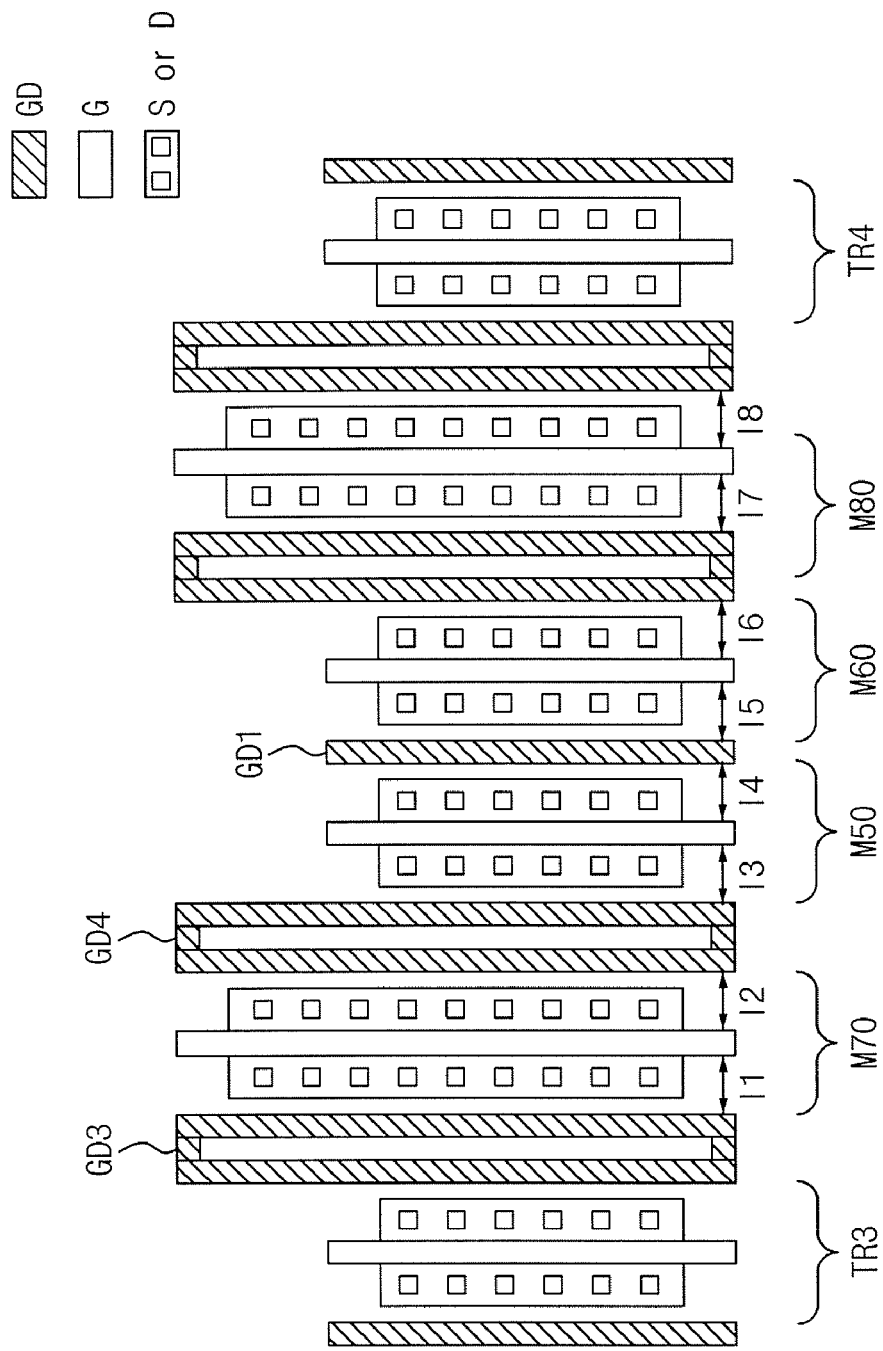

FIG. 18 shows another embodiment of the present invention, wherein the gate dummy pattern GD2 in the structure of FIG. 17 is substituted with a gate dummy pattern GD4 that includes two gate dummies having the same length.

Referring to FIG. 18, gate dummy patterns GD4 having the same length as the gate of the MOS transistors in the MOS transistor pair M70 and M80 are formed between the MOS transistor M50 and the MOS transistor M70 and between the MOS transistor M60 and the MOS transistor M80. Herein, the gate dummy pattern GD4 has a structure wherein two gate dummies, each having the same length as the gate G of the MOS transistors M70 and M80, are connected via coupling parts. It is preferable that the coupling parts connect the ends of the two gate dummies, such that the gate dummy pattern GD4 has a rectangular structure.

In this case, the influence between the MOS transistor pair M50 and M60 and the MOS transistor pair M70 and M80 is minimized by the gate dummy pattern GD4 during the manufacturing process. As such, variation in the gate critical dimension is reduced and a reduction in the electric characteristics of the MOS transistor pair <M50, M60> and the MOS transistor pair <M70, M80> can be prevented.

Figure 19:
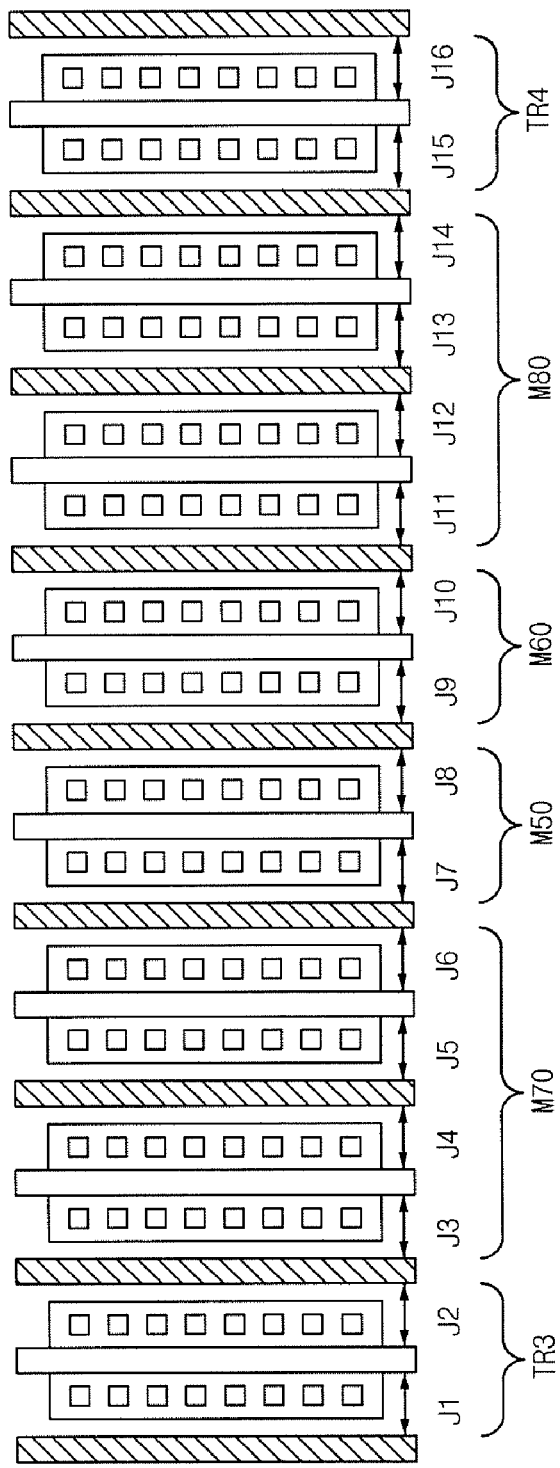

FIG. 19 illustrates a structure of a semiconductor device according to yet another embodiment of the present invention.

Specifically, referring to FIG. 19, the semiconductor device according to yet another embodiment of the present invention has a structure wherein the lengths of the gates of the MOS transistors <M50, M60> and <M70, M80> (which require the same electric characteristics) and the lengths of the gates of the MOS transistors TR3 and TR4 are all the same.

In other words, MOS transistors M70 and M80 having a large length are laid out to have the same length as the other MOS transistors M50, M60, TR3, and TR4. Further, gate dummy patterns GD having the same length as the gates G are formed on both sides of the MOS transistors M50, M60, M70, M80, TR3, and TR4. Herein, it is preferable that spacings 31 through 316, which are the spaces between the gate G of the MOS transistors M50, M60, M70, M80, TR3 and TR4 and the gate dummy GD, are all uniform.

As such, if the MOS transistors M50, M60, M70, M80, TR3, and TR4 are laid out so as to have the same length, influences on the active region become the same, and thus a variation in the gate critical dimension can be minimized. Also, uniformity to the chemical mechanical polishing/planarization process is enhanced, and thus an enhanced patterning can be obtained during the patterning process.

As described above, in the present invention the gate pads are standardized in a rectangular shape, and thus the critical points of the gate pad can be decreased. This leads to an increased process margin and a decreased resistance due to the layout structure. Thus, the deterioration of the circuit properties of a transistor can be prevented.

Also, in the present invention the active regions are arranged regularly and the gate pads are standardized. This makes it possible to enhance the uniformity of the gate critical dimension and also facilitates an optical proximity correction operation.

Further, in the present invention the structure of the dummy gate pattern can be stabilized, and thus substrate contamination due to a collapse of the dummy gate pattern and generation of a device defect due to the substrate contamination can both be prevented.

Further, in the present invention it is possible to minimize the variation in process deviation generated during a photo process and an etching process.

Further, in the present invention when the dummy gates are disposed, consideration is given to the distance between the transistors and the length of the peripheral gate, and thus the process deviation can be minimized.

Further, in the present invention a pattern capable of supporting the dummy gate is provided, and thus defects in the dummy gate can be prevented.

Further, in the present invention the uniformity of a critical region of the gate is enhanced due to the dummy gate, and thus the operation accuracy of a transistor is improved.

Further, the present invention provides a metal line pattern forming method in which the density difference of the metal line pattern is reduced, and thus has an advantage in that dishing due to the chemical mechanical polishing process is prevented, and thus a uniformity of the metal line pattern is enhanced.

Further, the present invention provides a metal line pattern forming method in which the size of a power metal line pattern, which is typically reduced with a high integration, is complemented. Thus leading to an advantage in that the power is stably supplied to a semiconductor memory.

Further, the present invention provides a metal line pattern forming method in which at least two dummy metal line patterns, which are electrically divided in one direction, are disposed between metal line patterns, leading to an advantage in that shorts between metal lines are reduced.

Further, the present invention provides a metal line pattern forming method in which an auxiliary dummy metal line pattern supports a dummy metal line pattern, leading to an advantage in that the dummy metal line pattern is stabilized.

Further, in the present invention MOS transistor pairs that require the same electric characteristics are disposed symmetrically with respect to a predetermined reference line, and thus electric characteristics of the respective MOS transistor pairs are substantially the same.

Further, in the present invention a dummy gate pattern, which can be formed in various shapes and is capable of minimizing outside influences, is formed at both sides of the symmetrically disposed MOS transistor. When using the dummy gate pattern, the electric characteristics of the respective MOS transistor pairs are substantially the same, and at the same time, variation in the gate critical dimension is reduced, thereby reducing diminishment in the electric characteristic of the MOS transistor.

Further, in the present invention MOS transistor pairs that require the same electric characteristics and other MOS transistors that are disposed adjacently thereto are laid out so as to have the same length, and thus variation in the gate critical dimension can be minimized and uniformity of the chemical mechanical polishing/planarization can be enhanced.

Further, the present invention has an advantage in that MOS transistors that are used when constructing a differential pair or a current mirror can be laid out as described above, and thus the transistors of the differential pair or current mirror have the same gate width and length on a pattern.

Further, in the present invention MOS transistors constructing a differential pair or a current mirror can be laid out as described above in a quad coupled receiver type input/output buffer, and thus electric characteristics of the MOS transistors used to construct the differential pair or the current mirror are substantially the same and output characteristic of the input/output buffer can be enhanced.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A method of forming a dummy gate pattern in a semiconductor device comprising the steps of:
forming a semiconductor material layer having an active region defined thereon;
forming a gate over at least the active region to form a transistor, the gate comprising:
a gate line extending in a first direction over at least the active region;
forming a gate pad outside the active region to connect to the gate line;
forming a dummy gate pattern having at least two dummy gates in a region outside of the active region of the transistor;
forming an auxiliary pattern for partially coupling end portions of the dummy gates to have an inner blank space, wherein the auxiliary pattern is formed to structurally complement the dummy gates in a space therebetween; and forming a connecting pattern configured to connect middle portions of the dummy gates, wherein the length of the dummy gates is the same as a length of the gate.

2. A method of forming a dummy gate pattern in a semiconductor device comprising the steps of:

forming a semiconductor material layer having an active region defined thereon;

forming a gate over at least the active region to form a transistor;

forming a dummy gate pattern having at least two dummy gates in a region outside of the active region of the transistor;

forming an auxiliary pattern for partially coupling end portions of the dummy gates to have an inner blank space;

forming a connecting pattern configured to connect middle portions of the dummy gate, wherein the auxiliary pattern is formed to structurally complement the dummy gates in a space therebetween, wherein the length of the dummy gates is the same as a length of the gate, which includes a gate line and a gate pad.

* * * * *